US006888194B2

(12) United States Patent
Yoshino

(10) Patent No.: US 6,888,194 B2
(45) Date of Patent: May 3, 2005

(54) NONVOLATILE SEMICONDUCTOR MEMORY DEVICE, MANUFACTURING METHOD THEREOF, AND OPERATING METHOD THEREOF

(75) Inventor: Akira Yoshino, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 120 days.

(21) Appl. No.: 10/374,840

(22) Filed: Feb. 26, 2003

(65) Prior Publication Data

US 2003/0160280 A1 Aug. 28, 2003

(30) Foreign Application Priority Data

Feb. 27, 2002 (JP) ........................................ 2002-051428

(51) Int. Cl.[7] .............................................. H01L 29/792
(52) U.S. Cl. ........................................ 257/324; 257/317
(58) Field of Search .................................. 257/324, 315, 257/316, 317

(56) References Cited

U.S. PATENT DOCUMENTS 5,768,192 A      6/1998  Eitan
5,838,041 A  * 11/1998  Sakagami et al. .......... 257/324
6,798,028 B2 *  9/2004  Horstmann et al. ......... 257/412
6,828,618 B2 * 12/2004  Baker et al. ................. 257/311

OTHER PUBLICATIONS

"Twin MONOS Cell with Dual Control Gates", *2000 Symposium on VLSI Technology Digest of Technical Papers*, pp. 122–123, by Yutaka Hayashi et al.

* cited by examiner

*Primary Examiner*—David Nelms
*Assistant Examiner*—Quoc Hoang
(74) *Attorney, Agent, or Firm*—Darryl G. Walker; Bradley T. Sako

(57) ABSTRACT

Nonvolatile memory elements are disclosed which can have increased capacity, reduced operating voltage and/or faster operating speeds. According to one embodiment, a nonvolatile memory element can include a first diffusion layer (2) and a second diffusion layer (3) formed in a main surface of a substrate (1). A laminate film can be formed near a first diffusion layer (2) and/or a second diffusion layers (3) that includes a first insulating film (4a or 4), a second insulating film (5a or 5), and a third insulating film (6a or 6). A gate insulating film (7) can be formed a channel region and gate electrode (8) can be formed to cover gate insulating film (7) and the laminate film(s) that has a T-shape. A gate electrode (8) can have end portions that sandwich a first insulating film (4a or 4), a second insulating film (5a or 5), and a third insulating film (6a or 6) with a first diffusion layer (2) and/or second diffusion layer (3).

9 Claims, 20 Drawing Sheets

(a)

(b)

(c)

(a)

(b)

NONVOLATILE SEMICONDUCTOR MEMORY DEVICE, MANUFACTURING METHOD THEREOF, AND OPERATING METHOD THEREOF

TECHNICAL FIELD

The present invention relates generally to a nonvolatile semiconductor memory device, manufacturing method and operating method, and more particularly to a Metal Oxide Nitride Oxide Semiconductor (MONOS) type nonvolatile memory device, manufacturing method and operating method.

BACKGROUND OF THE INVENTION

In general, nonvolatile memory devices of the metal-insulator-semiconductor (MIS) type can be broadly divided into two basic types of devices: Metal Nitride Oxide Semiconductor (MNOS) type transistors and floating gate (FG) type transistors.

MNOS type transistors typically store a charge, which can represent information, within one or more insulating films of a gate insulating film. For example, in the case of a two-layer gate insulating film, charge may be stored at interface states, or the like, formed at a boundary layer between two insulating films. One example of such an arrangement can be an MNOS type device. In addition to such a two-layer arrangement, other types of MNOS type devices can include a silicon oxide film formed on a silicon nitride film. Such devices can be referred to as Metal Oxide Nitride Oxide Semiconductor (MONOS) type devices.

In the case of FG type transistors, charge can be stored in a floating gate which is provided in addition to another (e.g., control gate) of the transistor. For example, a FG type transistor may include a first gate electrode that may be insulated from other conductive structures (e.g., can float) and can be formed on a silicon oxide film. The silicon oxide film may be formed on a main surface of a silicon substrate. An interlayer insulating film, which may include a combination of a silicon oxide film and a silicon nitride film, is formed on the first gate electrode. A second gate electrode, which may be a control gate electrode, is formed on the interlayer insulating film. Such a second gate electrode can cover the first gate electrode.

Write and erasure operations in such nonvolatile storage elements can occur in the following fashion. In an MNOS type transistor, in a write operation, electrons can be injected from the semiconductor substrate into the above-mentioned interface states by direct tunneling. Tunneling can occur through a silicon oxide film with a thickness in the order of 2 nanometers (nm). Conversely, erasure can occur when an electron is emitted from the interface states to the semiconductor substrate. Thus, interface states can become an electron trapping center.

In contrast to the MNOS type transistor, in the case of a FG type transistor write operation, charge can be injected from the semiconductor substrate into a first (i.e., floating) gate electrode. Such a mechanism can be by hot electron injection, with "hot" electrons being generated in the channel region and injected through a silicon oxide film with a thickness in the order of 10 nm. Erasure in a FG type transistor can include emitting electrons from the first gate electrode to the source or channel of the transistor. According to typical conventions, a write state (e.g., charge injected) can correspond to a logic 1 being the stored information. Conversely, an erase state (e.g., charge emitted) can correspond to a logic 0 being the stored information.

In nonvolatile memory devices, referred to as "flash" memories, the above M(O)NOS type transistors or FG type transistors can be utilized as the basic nonvolatile memory element. However, current mass produced flash memory products appear to use only FG type transistors as the nonvolatile memory element.

As the capacity of the above-described flash memory devices increases, it is desirable to continue shrinking the size of nonvolatile memory device elements. In addition or alternatively, it is also desirable to reduce the operating voltages for write, erase and/or read operations in such devices. However, such reductions in size and/or operation voltage can work against the goal of increasing operating speed.

In a FG gate type transistor, a holding characteristic for the information charge can suffer if an insulating film surrounding a floating gate is not sufficiently thick. As a result, a relatively thick tunneling oxide of about 9 nm or more is employed between the main surface of a semiconductor substrate and a floating gate electrode. However, such a tunneling oxide thickness can require a certain operating erasure potential to ensure adequate charge transfer in a write or erase operation. Thus, such a tunnel oxide thickness can limit the extent to which write and/or erase voltages can be reduced.

In addition, the manufacturing processes for FG type flash memory products can be complex and hence difficult to simplify. Thus, as FG type nonvolatile elements are reduced in size, yields can be reduced. Because of this, it can be difficult to reduce the cost of manufacturing such flash memory products.

In contrast to FG type transistors, in MNOS type transistors, a tunnel oxide between the main surface of a semiconductor substrate and a silicon nitride film can be about 3 nm or less. Such a smaller thickness can allow for lower operating voltages. In particular, a smaller write or erase voltage can be used.

Thus, because MNOS type devices present the above theoretical advantage of lower write and/or erase voltages, various studies in recent years have been conducted to make the use of MNOS type devices practical for use in semiconductor integrated circuit devices.

Among various conventional techniques that utilize an MNOS type transistor as a flash memory nonvolatile element is that shown in U.S. Pat. No. 5,768,192 (hereinafter referred to as the first conventional example) and that shown in "Twin MONOS Cell with Dual Control Gates", 2000 *Symposium on VLSI Technology Digest of Technical Papers*, pp. 122–123, by Yutaka Hayashi et al. (referred to herein as the second conventional example).

The first conventional example will now be described as prior art with reference to FIGS. 24–26. FIG. 24 is a substantially sectional view of a MONOS type transistor proposed as a nonvolatile memory element for a flash memory.

As shown in FIG. 24, a first diffusion layer 102 and a second diffusion layer 103 are formed in a silicon substrate 101. First and second diffusion layers (102 and 103) may be N+ diffusion layers in a main surface of a P-conductivity type silicon substrate 101. A first silicon oxide film 104, a silicon nitride film 105, and a second silicon oxide film 106 can be formed on a silicon substrate 101. Such layers may result in a laminated film (ONO structure) disposed between first and second diffusion layers (102 and 103). Further, a gate electrode 107 is formed using polycrystalline silicon on the second oxide film 106. Such an arrangement can form a fundamental MONOS type transistor.

Next, the basic operation of the above-mentioned MONOS type transistor will be described. In a write operation, charge (electrons in the current example) can be trapped in a silicon nitride film 105. As shown in FIG. 25, a silicon substrate 101 and a first diffusion layer 102 can be kept at a ground potential, a second diffusion layer 103 is set to voltage $V_W$, which can be 5 volts, and a gate electrode 107 can be set to a voltage $V_{GW}$, which can be on the order of 4 volts. When such voltages are applied, an electron flow 108 (e.g., a channel current) is produced from the first diffusion layer 102, which serves as a source, to the second diffusion layer 103, which serves as the drain. Such a current includes channel hot electrons (CHEs) in the vicinity of the second diffusion layer 103. Such CHEs can cross the barrier of the first oxide film 104 and become trapped in a region of the silicon nitride film 106. This is shown as charge trapping region 109 in FIG. 25. Thus, in the conventional write operation described, information charge can be stored in the region of the silicon nitride film 105 which is located near the end of the second diffusion layer 103.

FIG. 26 shows a read operation of the first conventional example. In a read operation, the second diffusion layer 103, which can serve as a source, is kept at a ground potential, while a first diffusion layer 102, which can serve as a drain, is kept at a voltage $V_R$, which can be set to 3 volts. A gate electrode 107 can be set to a voltage $V_{GR}$, which can be in the order of 1.5 volts. A silicon substrate 101 can be at a ground potential.

A conventional read operation can vary according to the type of data stored. In the case of a logic "1", in which electrons are written into a trapping region 109, essentially no current flows between a first diffusion layer 102 and a second diffusion layer 103. In contrast, the case of a logic "0", in which electrons are essentially not written into a trapping region 109, a current flows between a first diffusion layer 102 and a second diffusion layer 103. In this way, it is possible to read out information written into a conventional SONOS type device.

Referring back to FIG. 25, an erase operation for the first conventional example will now be described. In an erase operation, the silicon substrate 101 and the first diffusion layer 102 are kept and a ground potential, while a second diffusion layer 103 is kept at a voltage $V_E$, which can be set to 5 volts. The gate electrode 107 can be set to a voltage $V_{GE}$, which can be in the order of −5 volts. When such voltages are applied, energy band bending can occur in a region located at an end portion of the second diffusion layer 103 overlapped by the gate electrode 107. Such band bending can enable "holes", produced by interband tunneling, to be injected into the trapping region 109 to erase the electron charge therein.

Next, the second conventional example will be described as prior art with reference to FIG. 27. FIG. 27 is a substantially sectional view of a MONOS type transistors proposed as a nonvolatile memory element for a flash memory. A feature of this particular conventional example is how a word line and control gate electrodes (which can become word lines in an array) are formed in a cell array structure.

As shown in FIG. 27, a first diffusion layer 202 and a second diffusion layer 203 are formed in a silicon substrate 201. First and second diffusion layers (202 and 203) may be N+ diffusion layers in a main surface of a P-conductivity type silicon substrate 201. Then, a first control gate electrode 204, second control gate electrode 205, and a word electrode 206 are formed over the silicon substrate 201, between the first and second diffusion layers (202 and 203), and separated by insulating films, as shown.

In FIG. 27, the insulating film between the (first and second) control gate electrodes (204 and 205) and the silicon substrate 201 is an insulating film having an ONO structure, as in the case of the first conventional example. The insulating film between the word electrode 206 and the substrate is single layer silicon oxide film. Further, the insulating film separating (first and second) control gate electrodes (204 and 205) and the word electrode 206 is an insulating film having an ONO structure.

Referring still to FIG. 27, in a write operation of the second conventional example, charge (in this case electrons) are trapped in trapping regions 207 and 208 which are located under the above-mentioned first and second control gate electrodes (204 and 205), respectively. As noted above, trapping regions 207 and 208 can have an ONO structure. In an erase operation, voltages are applied between the first and second control gate electrodes (204 and 205) and first and second diffusion layers (202 and 203), so that holes produced by interband tunneling (as described in the first conventional example) are injected into the trapping regions 207 and 208.

The above first and second conventional examples may have drawbacks.

In the case of the first conventional example, information retention requirements may limit how thin an insulating layer can be between a control gate electrode 107 and a silicon substrate 101. That is, information (e.g., charge) retention requirements may limit how thin a first silicon oxide film 104, a silicon nitride film 105, and a second silicon oxide film 106 can be. The present inventor has conducted various trial experiments on fundamental characteristics of the MONOS structure, like that of the first conventional example. Such experiments having shown that in order to essentially ensure an information retention period of 10 years, for an ONO structure that includes silicon oxide film, a lower limit to a thin film thickness is on the order of 8 nm.

Such a minimum thickness can result in drawbacks. It is desirable to provide as fast an operation as possible in a nonvolatile memory device. Limits in minimum thickness of an insulating film (or films) can result corresponding limits in the read speed of such devices. For example, capacitance per unit area of gate dielectric may depend on overall dielectric thickness/material between a control gate electrode 107 and a silicon substrate 101.

In the above-described second conventional example, a MONOS type transistor has first and second control gate electrodes as well as a word electrode formed in a single memory cell. In particular, control gate electrodes can be sidewall conductive films formed on side walls of the word electrode. When such a structure is used, a size of a control gate electrode in a channel direction can be reduced. This can reduce the effective channel length of the resulting transistor device. In this way, it can be possible to speed up a read operation for the above device.

However, as indicated above, in the second conventional example control gate electrodes are formed on the sides of a word electrode. Thus, control gates electrode lines and word electrode lines (e.g., word lines) are arranged in the same direction within a cell array. Further, in the second conventional example control gate electrode lines and word electrode lines are parallel to bit lines, which are formed by first (or second) diffusion layers. However, due to a common arrangement of circuits peripheral to a memory cell array, it may be desirable to have bit lines in a direction that is perpendicular to word lines. Such an arrangement can be difficult to achieve with the second conventional example.

Also, because a second conventional example has control gate electrodes as sidewall conductive films on a word electrode, control gate electrodes may have very small widths with respect to other wirings. Such small widths can present an increased wiring resistance that introduces delay into signal transmission. In view of this, it can be difficult to incorporate such an approach into memory cell array applications.

In light of the above-mentioned drawbacks of the conventional examples, it would be desirable to arrive at some way of increasing the capacity of a flash memory while reducing the operating voltage and/or increasing the operating speed.

In addition or alternatively, it would be desirable to arrive at a practical way of using a MONOS type transistor as a nonvolatile memory element for a flash memory.

SUMMARY OF THE INVENTION

The present invention can include a nonvolatile memory device having a first diffusion layer and second diffusion layer separated by a channel region. The nonvolatile memory device also includes a first insulating layer, for trapping a charge, that is formed on a first portion of the channel region adjacent to the first diffusion layer, and a second insulating layer, different from the first insulating layer, formed on a second portion or the channel region different from the first portion of the channel region. The nonvolatile memory device also includes an integrated gate electrode that covers the first insulating layer and second insulating layer.

According to one aspect of the embodiments, a capacitance per unit area of the second insulating layer can be larger than that of the first insulating layer.

According to another aspect of the embodiments, a first insulating layer can be a laminate structure comprising a first silicon oxide film, a different film, and a second silicon oxide film. A different film can be a silicon nitride film. In addition or alternatively, a different film can be a metal oxide film.

According to another aspect of the embodiments, an integrated gate electrode can have a "T" shape in cross section when viewed along a channel length direction. In one particular arrangement, an integrated gate electrode can include end portions. A first insulating layer can be sandwiched between at least one end portion and the first diffusion layer.

According to another aspect of the embodiments, an integrated gate electrode can include a central portion formed over a second insulating layer and at least one end portion formed over a first insulating layer. The at least one end portion can be formed from a different material than a central portion.

According to another aspect of the embodiments, a nonvolatile memory device can also include a word line of a memory cell array coupled to a gate electrode. A bit line of a memory cell array can be formed from at least one of the diffusion layers. In one particular arrangement, a word line can be essentially orthogonal to the bit line.

According to another aspect of the embodiments, a nonvolatile memory device can also include a third insulating layer that covers the first diffusion layer. The third insulating layer can have a larger capacitance per unit area than the first insulating layer. In addition, a conductive layer can be formed on the third insulating layer.

The present invention may also include a method of storing an information charge in a nonvolatile memory device. The method can include the steps of applying a voltage between a conductive layer, formed on a third insulating layer and over a gate electrode, and a first diffusion layer. The first diffusion layer can be formed under the third insulating layer and adjacent to a first insulating layer. The first insulating layer can be for trapping charge and can be formed on a first portion of a channel next to a second portion of the channel. A second portion of the channel can be covered by a second insulating film. A first insulating layer can have a lower capacitance per unit area than third and second insulating layers. The method generates holes in the proximity of a surface of a first diffusion layer by interband tunneling.

According to one aspect of the embodiments, a method may also include applying a potential to the gate electrode that is lower than that of the first diffusion layer to attract the generated holes to the first insulating film.

The present invention may also include a method of manufacturing a nonvolatile semiconductor device. The method can include forming a first insulating layer, for trapping charge, and forming a groove insulating film on the first insulating layer. In addition, the method can also include forming a groove in the groove insulating film and removing at least a portion of the first insulating layer within the groove to expose a surface of a substrate. A second insulating layer may be formed on an exposed surface of the substrate and the groove may be filled with a first conductive film. A planarizing of the first conductive film can form a gate electrode in the groove. A groove insulating film can be removed and a second conductive film can be formed on a second insulating layer and in electrical contact with the gate electrode. An etching can then be performed on a second conductive film to form a sidewall conductive film on a side wall of, and in electrical contact with, a gate electrode. An impurity can be introduced into a substrate with a gate electrode and sidewall conductive film as a mask to form a first diffusion layer and a second diffusion layer.

According to one aspect of the embodiments, a first conductive film can include a high melting point polycide film and a second conductive film can include a polycrystalline silicon film containing an impurity.

According to another aspect of the embodiments, a first insulating layer can be a laminate structure comprising a first silicon oxide film, a different film, and a second silicon oxide film. Such a different film can be selected from the group of a silicon nitride film and a metal oxide film.

According to another aspect of the embodiments, a method may also include forming at least a first diffusion layer essentially parallel to the gate electrode and at least one sidewall conductive film. In addition, a conductive word line can be formed over a gate electrode and over at least one sidewall conductive film. The conductive word line can be essentially perpendicular to the first diffusion layer.

The present invention may also include a method of manufacturing a nonvolatile semiconductor device. The method may include the steps of: forming a first insulating layer, for trapping charge, forming a groove insulating film on the first insulating layer, forming a slit-shaped groove that is substantially longer in gate width direction than a gate length direction in the groove insulating film, removing at least a portion of the first insulating layer within the slit-shaped groove to expose a surface of a substrate, forming a second insulating layer on the exposed surface of the substrate, filling the slit-shaped groove with a first conductive film, planarizing the first conductive film to form a slit-shaped electrode in the slit-shaped groove, removing the groove insulating film and forming a second conductive film over the slit-shaped electrode and the first insulating layer, introducing an impurity into the substrate with the slit-shaped electrode as a mask to form a first diffusion layer and a second diffusion layer, and forming a wiring layer from the second conductive film and gate electrodes from the slit-shaped electrode with a same process step.

According to one aspect of the embodiments, the present invention may also include a first conductive film being a polycrystalline silicon film containing an impurity and a second conductive film having a high melting point polycide film.

According to another aspect of the embodiments, a method may also include forming a conductive layer on a first insulating layer prior to forming the groove insulating film.

According to another aspect of the embodiments, a first insulating layer can be a laminate structure comprising a first silicon oxide film, a different film, and a second silicon oxide film. A different film being selected from the group of a silicon nitride film and a metal oxide film.

According to another aspect of the embodiments, at least a first diffusion layer can extend in a first direction, and forming the wiring layer from the second conductive film can form word lines that are essentially orthogonal to the first direction.

DETAILED DESCRIPTION OF THE EMBODIMENTS

The present invention will hereinafter be described in more detail on the basis of various particular embodiments with reference to accompanying figures.

Figure 1:
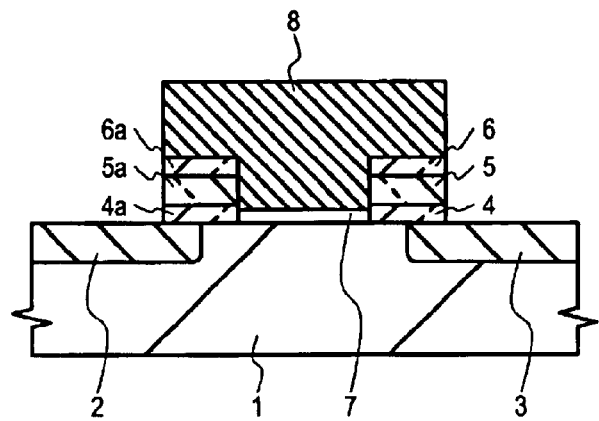
FIG. 1 is a sectional view of a nonvolatile memory element according to a first embodiment of the present invention.
Figure 2:
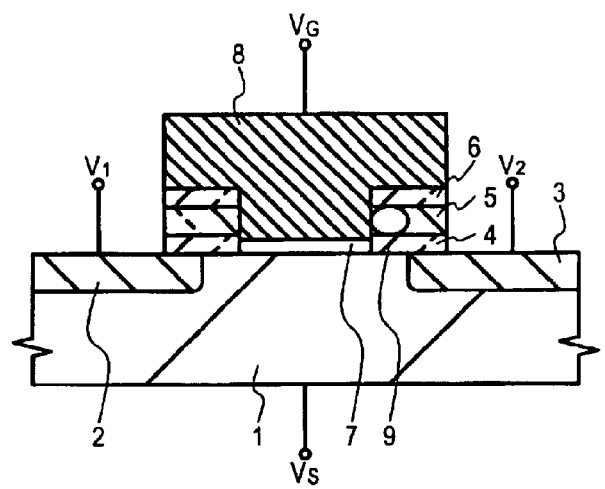
FIG. 2 is a sectional view showing the operation of a nonvolatile memory element according to an embodiment of the present invention.
Figure 3:
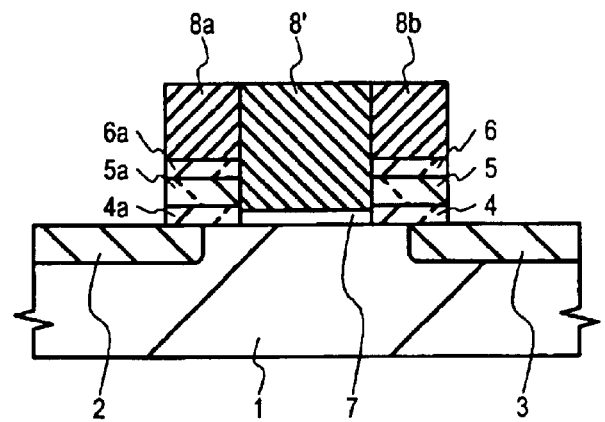
FIG. 3 is a sectional view of a nonvolatile memory element according to another embodiment of the present invention.
Figure 4:
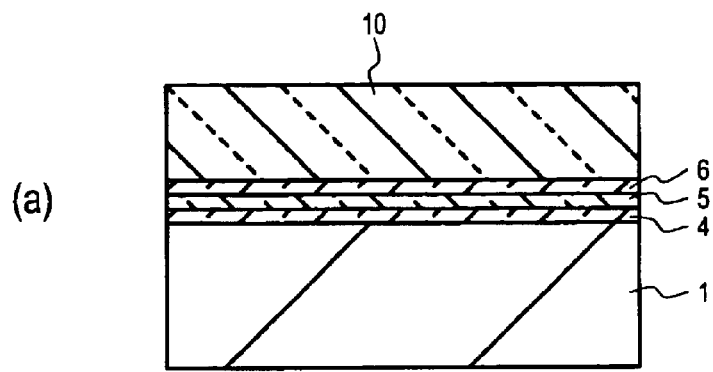
FIGS. 4(a) to 4(c) are sectional views showing selected steps for a method of manufacturing an embodiment like that of FIG. 3.
Figure 4:
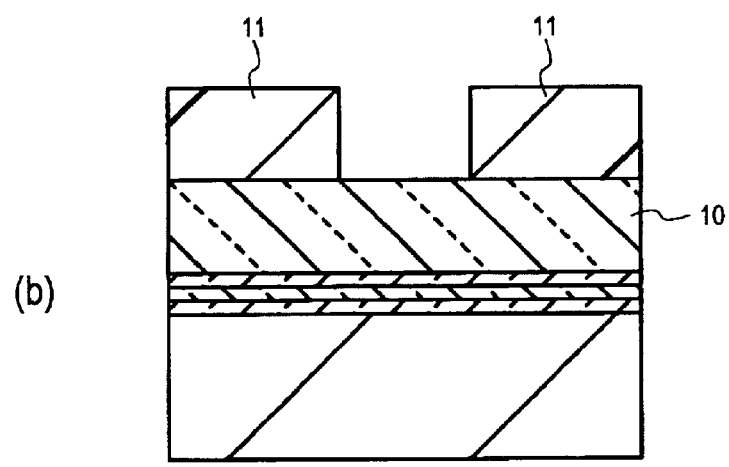
Figure 4:
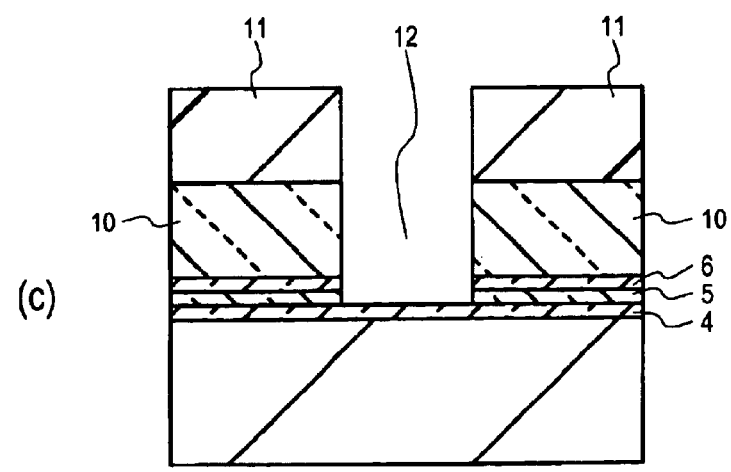
Figure 5:
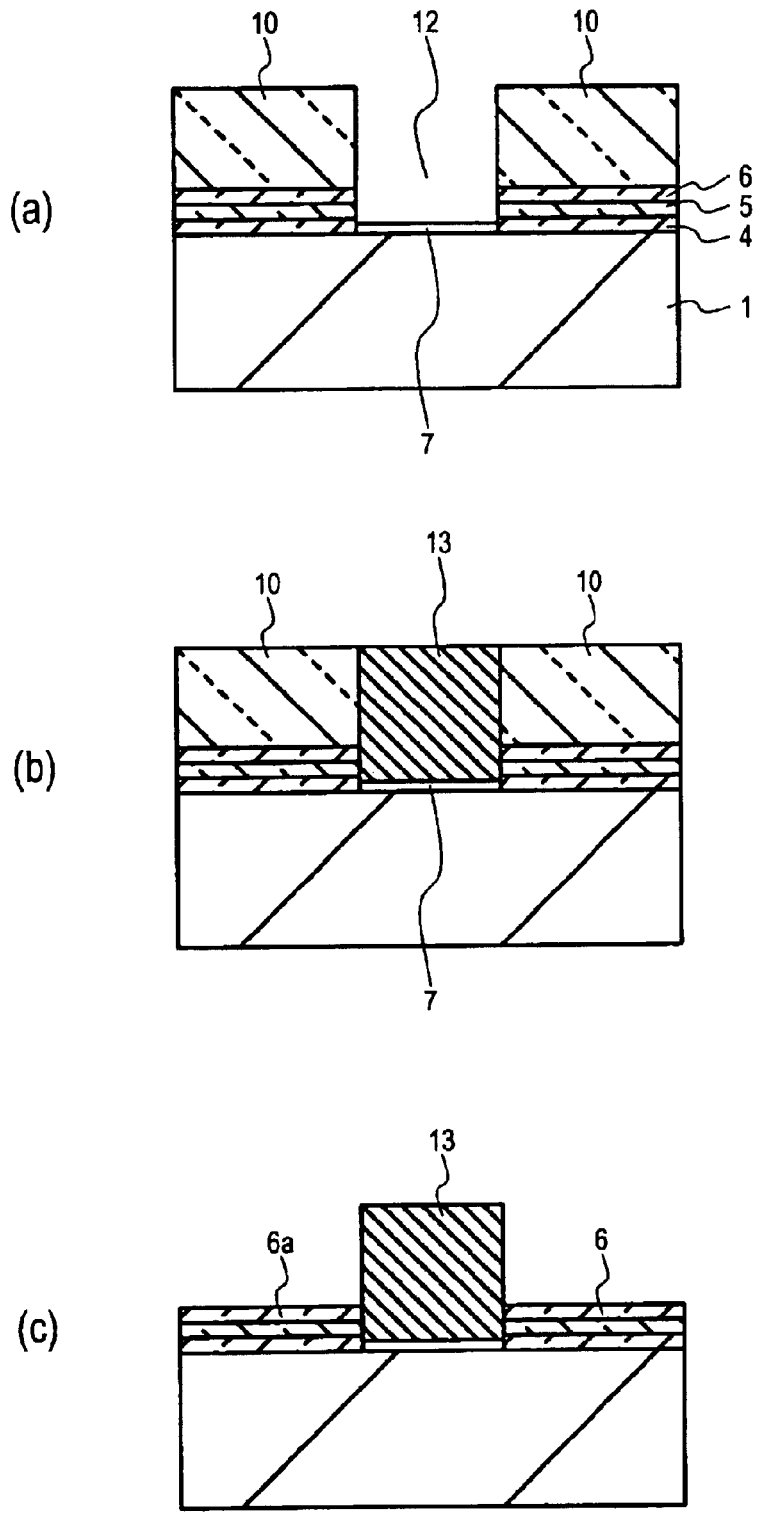
FIGS. 5(a) to 5(c) are sectional views showing further selected steps of the method shown in FIGS. 4(a) to 4(c).
Figure 6:
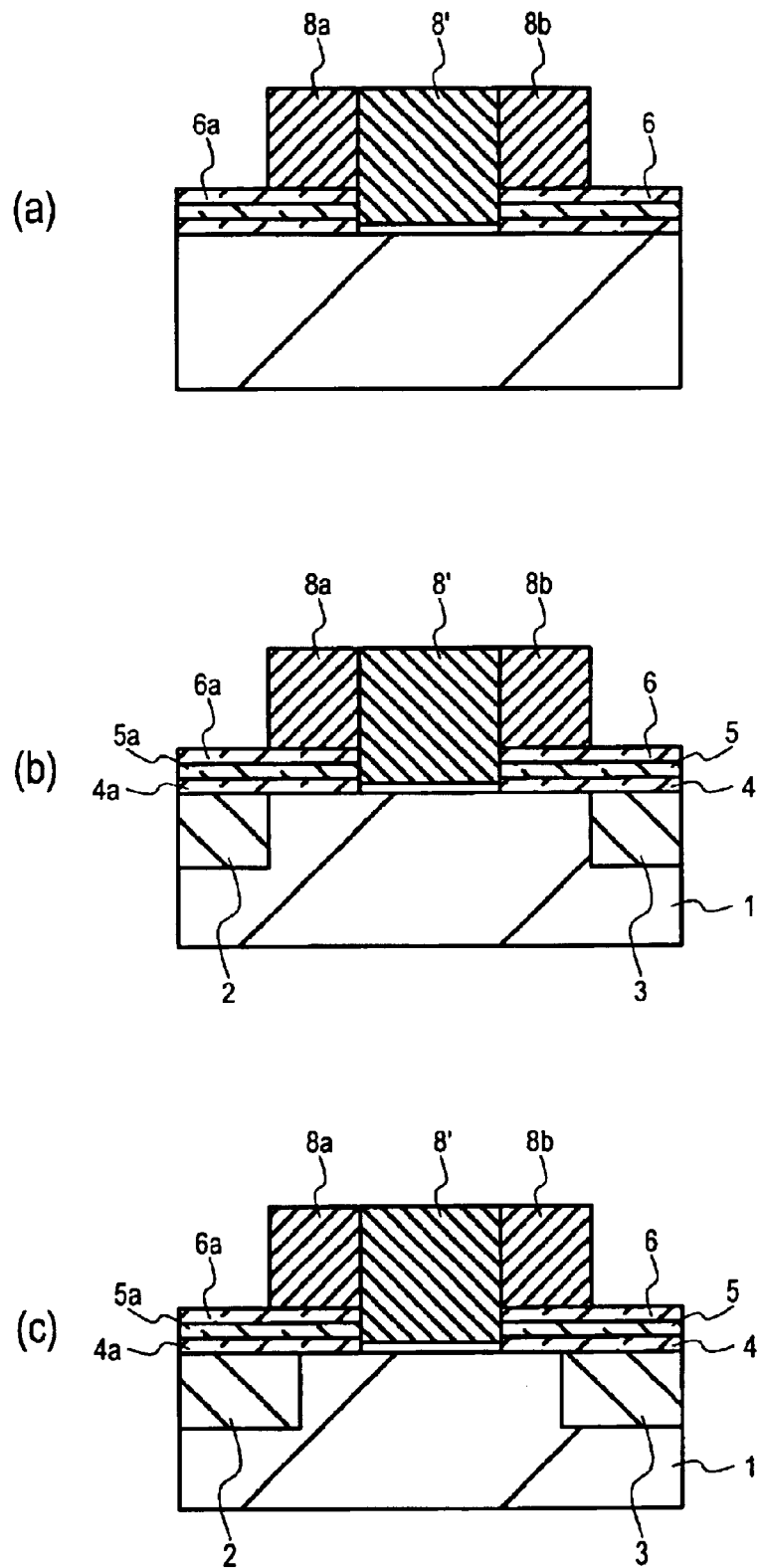
FIGS. 6(a) to 6(c) are sectional views showing further selected steps of the method shown in FIGS. 5(a) to 5(c).
Figure 7:
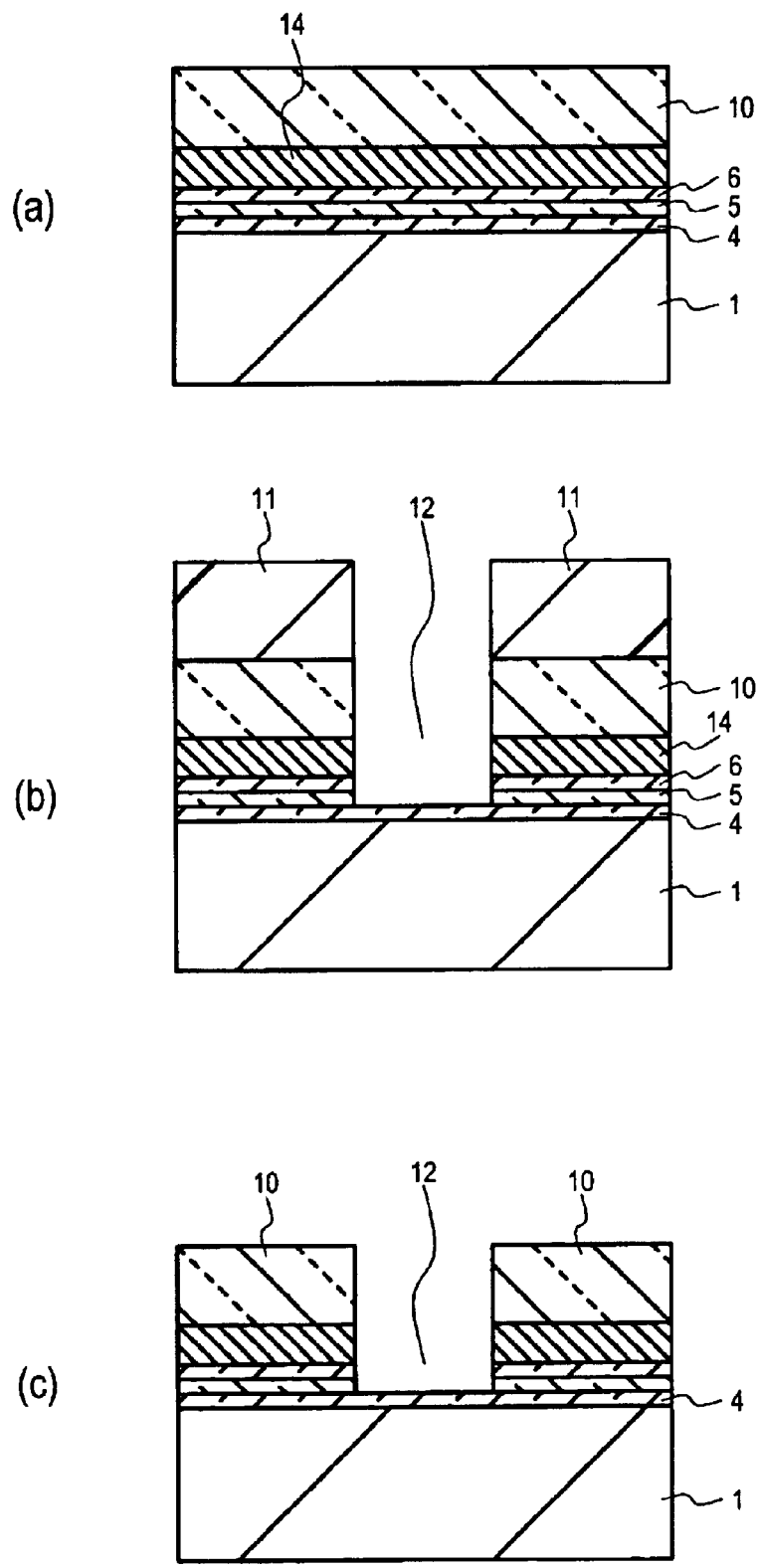
FIGS. 7(a) to 7(c) are sectional views showing selected steps for manufacturing a nonvolatile memory element according to another embodiment.
Figure 8:
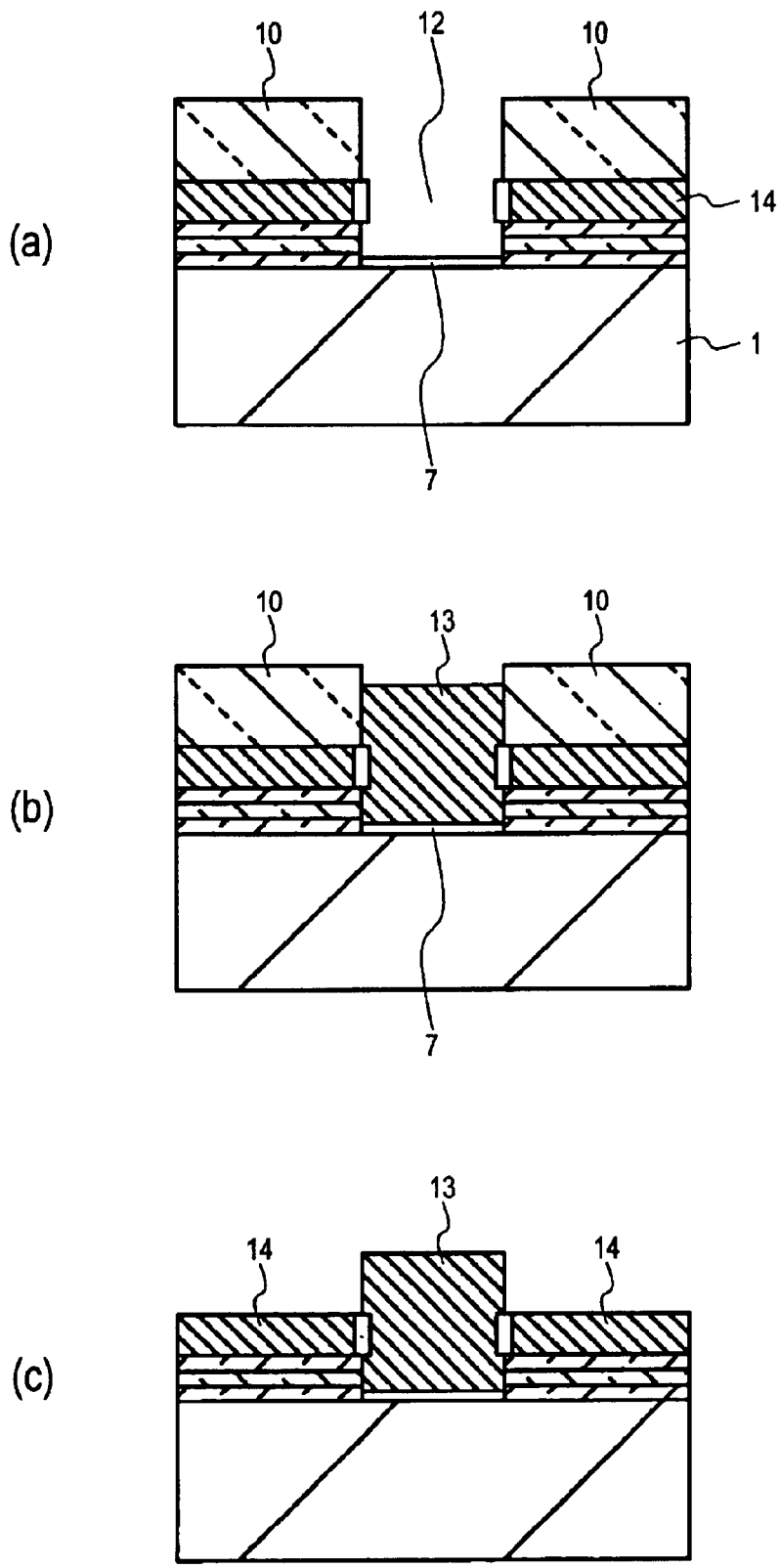
FIGS. 8(a) to 8(c) are sectional views showing further selected steps of the method shown in FIGS. 7(a) to 7(c).
Figure 9:
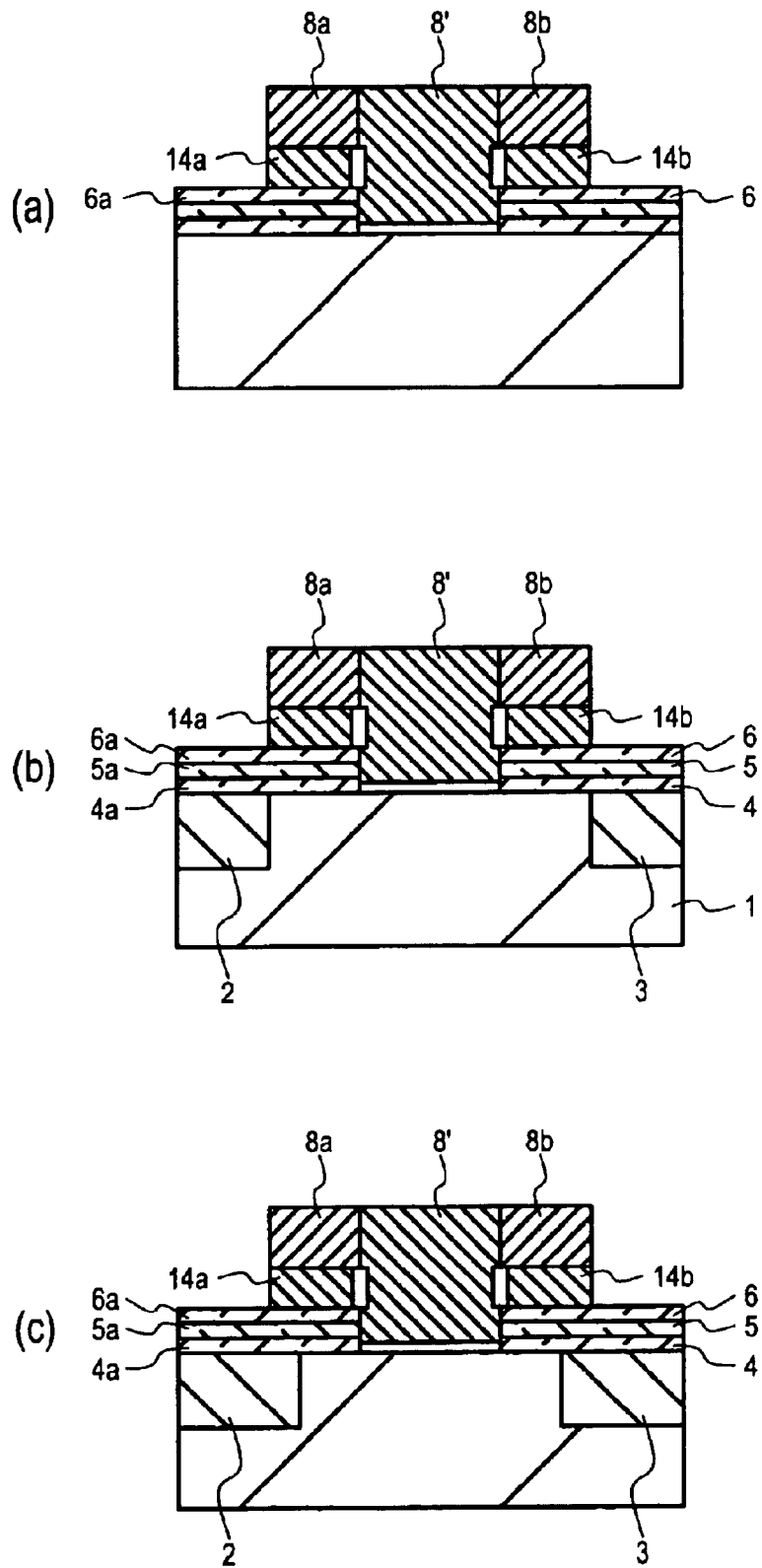
FIGS. 9(a) to 9(c) are sectional views showing further selected steps of the method shown in FIGS. 8(a) to 8(c).

Embodiments of the present invention will now be described with reference to FIGS. 1 to 9(c). FIGS. 1 and 3 are sectional views showing the basic structure of a nonvolatile memory element according to the present invention, which may be used in a flash memory. FIGS. 4(a) to 9(c) are sectional views showing various steps according to a manufacturing method according to an embodiment.

Referring to FIG. 1, a nonvolatile memory element may include a first diffusion layer 2, a second diffusion layer 3, and a substrate 1. A substrate 1 may include silicon, more particularly silicon of a P-conductivity type. First and second diffusion layers (2 and 3) may include N+ diffusion layers in the substrate 1. A nonvolatile memory element may further include a laminate film near a first diffusion layer 2 and/or a second diffusion layer 3. A laminate film may have an oxide-nitride-oxide (ONO) type structure.

Laminate film(s) may not be formed over part of a channel region. This is shown in the very particular example of FIG. 1 by first insulating films 4a and 4, second insulating films 5a and 5, and third insulating films 6a and 6 being formed adjacent to source/drain regions of a resulting transistor structure, but not over part of a channel region. Thus, the first embodiment nonvolatile memory element may include a gate insulating film 7, different from the above mentioned laminate film, that is formed over a channel region.

In one particular approach, first insulating films 4a and 4 may be silicon oxide films having a thickness in the order of about 4 nanometers (mu). Second insulating films 5a and 5 may be silicon nitride films having a thickness in the order of about 6 nm. Third insulating films 6a and 6 may be silicon oxide films having a thickness in the order of about 5 nm. A gate insulating film 7 may be a silicon oxide film or an oxynitride film having a thickness on the order of about 4 nm.

A gate electrode 8 can be formed to cover the above-described gate insulating film 7 and laminate film(s). In the example shown in FIGS. 1–3, a gate has a T-shape. As such, a gate electrode 8 can have end portions that overlap first diffusion layer 2 and second diffusion layer 3. In particular, one end portion may overlap first diffusion layer 2 on first insulating film 4a, second insulating film 5a, and third insulating film 6a . Similarly, another end portion may overlap second diffusion layer 3 on first insulating film 4, second insulating film 5, and third insulating film 6. A gate electrode 8 may be formed from various materials, including polycrystalline silicon (Si) containing an N-type impurity, polycrystalline silicon germanium (SiGe), polycrystalline silicon silicide (polycide), polycrystalline silicon metal (polymetal), or the like.

In the above-mentioned structure of a nonvolatile memory element, a silicon oxide film may be formed between a gate electrode 8 and one or both of second insulating films 5 and 5a. As noted above, such second insulating films (5 and 5a) can be formed from a silicon nitride film.

Next, the basic operation of a non-volatile memory element according to a first embodiment will now be described. Referring to FIG. 2, in one example of a write operation, a voltage of a substrate 1 $V_S$ and a voltage of a first diffusion layer 2 $V_1$ can be kept at a ground potential. A voltage of second diffusion layer 3 $V_2$ can be on the order of about 5 volts, and voltage of gate electrode 8 $V_G$ can be on the order of about 4 volts. When such voltages are applied, a flow of electrons can form a channel current from a first diffusion layer 2 to a second diffusion layer 3. Such electrons may include channel hot electrons (CHEs) in the vicinity of a second diffusion layer 3. CHEs can cross the barrier of a first insulating film 4, and can be stored as an information charge in a trapping region 9 of second insulating film 5. In such an arrangement, a first diffusion layer 2 can serve as a source, while a second diffusion layer 3 can serve as a drain.

In one example of a read operation of a first embodiment, a second diffusion layer 3 $V_2$ can be kept at a ground potential, a voltage of a first diffusion layer 2 $V_1$ can be on the order or about 3 volts, and a gate electrode 8 $V_G$ can be on the order of about 1.5 volts. If the transistor has been written to, a trapping of charge can be about 1000 electrons or less. In such an arrangement, a first diffusion layer 2 can serve as a drain, while a second diffusion layer 3 can serve as a source.

In the event that a logic "1" has be written into a non-volatile memory element according to a first embodiment, electrons may written to trapping region 9, as noted above. As a result, in a read operation, essentially no current flows between a first diffusion layer 2 and a second diffusion layer 3. In contrast, in the event a logic "0" has be written into a non-volatile memory element according to a first embodiment, electrons may not be written to a trapping region 9. As a result, in a read operation, a current can flow between a first diffusion layer 2 and a second diffusion layer 3.

In one example of an erase operation according to a first embodiment, voltage of a substrate 1 $V_S$ and a first diffusion layer 2 $V_1$ can be kept at a ground potential. A voltage of second diffusion layer 3 $V_2$ can be on the order of about 5 volts, and voltage of gate electrode 8 $V_G$ can be on the order of about −5 volts. When such voltages are applied, holes can be injected into the above-mentioned charge trapping region 9 to erase any information charge therein. Such holes may be produced by interband tunneling at an end portion of a second diffusion layer 3 overlapped by a gate electrode 8.

Another example of a nonvolatile memory element according to an embodiment of the present invention is shown in FIG. 3. In the example of FIG. 3, a gate electrode may have one portion formed from a different material than end portions.

As shown in FIG. 3, a nonvolatile memory element may include a first diffusion layer 2 and a second diffusion layer 3 formed in a main surface of a substrate 1. A laminate film may be included that is not formed over part of a channel region. This is shown in FIG. 3 by first insulating films 4a and 4, second insulating films 5a and 5, and third insulating films 6a and 6 being formed near first diffusion layer 2 and second diffusion layer 3. A gate insulating film 7, different from the above-mentioned laminate film(s), can be formed over a major region of a channel area.

Referring still to FIG. 3, a gate electrode 8' can be formed to cover the above-mentioned gate insulating film 7. In addition, a first gate electrode end portion 8a and second gate electrode end portion 8b can be formed to cover the above-mentioned laminate film(s). In particular, a first gate electrode end portion 8a and first diffusion layer 2 can sandwich a first insulating film 4a, second insulating film 5a, and third insulating film 6a. Similarly, a second gate electrode end portion 8b and second diffusion layer 3 can sandwich a first insulating film 4, second insulating film 5, and third insulating film 6. A gate electrode 8' may be formed from polycrystalline silicon (Si) containing an N-type impurity, or polycrystalline silicon germanium (SiGe). First and second gate electrode end portions (8a and 8b) can be made of polycide, polymetal, or the like. Alternatively, a converse structure may be used.

In the arrangement of FIG. 3, a silicon oxide film may be formed between gate electrode 8' and one or both of second insulating films 5 and 5a.

As shown in the embodiments of FIGS. 1 and 3, when a nonvolatile memory element has either of the above-mentioned structures, a thickness of a gate insulating film 7 can be made relatively small, and essentially independent of a laminate film having an ONO type structure. Thus, a capacitance value per unit area of the above mentioned gate insulating film 7 can be made larger than a capacitance value per unit area of the above-mentioned ONO type structure. Such an arrangement can lead to improvements in read operating speeds, while at the same time essentially not reducing a holding characteristic of information (e.g., charge retention) of a laminate film having a ONO type structure. In this way, improvements in operating speed can be compatible with a holding characteristic. It is additionally noted that by providing a silicon oxide film on side walls of a second insulating film 5 and/or 5a, a holding characteristic of a resulting structure may be further improved.

Next, a method of manufacturing a nonvolatile memory element of a MONOS type, according to one embodiment of the present invention, will be described.

Referring to FIG. 4(a), a silicon oxide film having a film thickness of about 4 nm may be formed by thermal oxidation of a P-conductivity type silicon substrate 1, to thereby provide a first insulating film 4. Then, a silicon nitride film having a film thickness in the order of about 6 nm may be formed, by a chemical vapor deposition (CVD) method, to provide second insulating film 5. A silicon oxide film having a film thickness of about 4 nm may be formed on a second insulating film 5, by a CVD method, to form a third insulating film 6. An alumina film or silicon nitride film having a film thickness of about 200 nm may be formed, to thereby provide an insulating film 10 for a groove.

Next, as shown in FIG. 4(b), a resist mask 11 can be formed over an insulating film 10 using known lithography technique that includes a groove pattern.

Then, as shown by FIG. 4(c), an insulating film 10 for a groove, a third insulating film 6, and second insulating film 5 can be etched with resist mask 11 as an etch mask to form a groove 12. Thereafter, a first insulating film 4 at the bottom of a groove 12 may be removed, by wet etching, for example.

Next, a thermal oxidation or oxynitriding treatment can be conducted using insulating film 10 for groove as a mask. This may form a gate insulating film 7 on a surface of a substrate 1 in a groove portion 12, as shown in FIG. 5(a). A gate insulating film 7 can be formed to have an effective film thickness that is thinner than an effective film thickness of a laminate film that can include a first insulating film 4, a second insulating film 5, and a third insulating film 6.

It is noted that an above oxidation or oxynitriding treatment can be conducted in an oxygen radical atmosphere. In such a case, side walls of a second insulating film 5, which can be silicon nitride, can be easily oxidized to thereby form a silicon oxide on those exposed regions.

Next, a first conductive film can be formed that covers gate insulating film 7 and fill a groove 12. A first conductive film may be a polycrystalline silicon film that contains an N-type impurity, for example. Portions of such a first conductive film can then be removed. As one example, a chemical mechanical polishing (CMP) method can use an insulating film 10 as a polishing stop. Such a step can form a buried conductive film 13, as shown in FIG. 5(b).

Next, as shown in FIG. 5(c), an insulating film 10 for a groove can be removed by wet etching, for example. This can result in a buried conductive film 13 that extends above third insulating films 6 and 6a. Buried conductive film 13 may then be processed into a predetermined pattern.

Next, a second conductive film may be deposited over an entire surface. A second conductive film can be formed from a tungsten polycide film having a film thickness on the order of about 200 nm. A second conductive film may then be etched back to form first gate electrode end portion 8a and second gate electrode end portion 8b as conductive films on the side walls of a gate electrode 8', as shown in FIG. 6(a).

Referring now to FIG. 6(b), an ion implantation may be conducted with a gate electrode 8', first gate electrode end portion 8a, and second gate electrode end portion 8b as masks. Such a step may implant ions through first insulating films (4 and 4a), second insulating films (5 and 5a), and third insulating films (6 and 6a), to thereby form a first diffusion layer 2 and a second diffusion layer 3 in a surface of silicon substrate 1. An implanted ion may be arsenic.

Next, a heat treatment can be conducted for impurity diffusion of implanted ions of the above-mentioned first and second diffusion layers (2 and 3). Such a diffusion can result in a first gate electrode end portion 8a and second gate electrode end portion 8b that overlap a first diffusion layer 2 and second diffusion layer 3, respectively, as shown in FIG. 6(c). After such a treatment, a nonvolatile memory element having a structure like that of FIG. 3 can be completed.

It is noted that if a polysilicon film containing an N-type impurity is deposited as a second conductive film, instead of a tungsten silicide, a resulting nonvolatile memory element can have a structure like that of FIG. 1.

Next, another method of manufacturing a nonvolatile memory element according to the present invention will be described with reference to FIGS. 7(a) to 9(c).

Referring to FIG. 7(a), like the description for FIG. 4(a), a first insulating film 4, second insulating film 5, and third insulating film 6 can be formed on a substrate 1. Then, as shown in FIG. 7(a), a conductive layer 14 can be formed on a third insulating film 6. A conductive layer 14 can be a polycrystalline silicon layer containing an N-type impurity. A film thickness of a first insulating layer 14 can be on the order of about 50 nm.

A silicon nitride film may then be formed to provide an insulating film 10 for a groove. Such a layer can have film thickness of about 150 nm.

Next, as shown in FIG. 7(b), a resist mask 11 that includes a groove pattern can be formed on an insulating film 10. The conductive layer 14, third insulating film 6 and second insulating film 5 can be etched with resist mask 11 as an etch mask to form a groove 12. Thereafter, a first insulating film 4 at the bottom of a groove 12 may be removed, by wet etching, for example, to thereby expose a bottom surface of a silicon substrate 1 in a groove 12.

Next, in step similar to that of FIG. 5(a), a thermal oxidation or oxynitriding treatment can be conducted using insulating film 10 for groove as a mask to form a gate insulating film 7 on a surface of a substrate 1, in a groove portion 12. This is shown in FIG. 8(a). In such a step, side walls of a conductive layer 14 exposed in a groove 12 can be oxidized to thereby form a silicon oxide on those exposed regions.

Next, in a step similar to that of FIG. 5(b), a buried conductive film 13 can be formed by forming a first conductive film that covers gate insulating film 7, and then removing excess portions thereof by a chemical mechanical polishing (CMP) method, for example, that can use an insulating film 10 as a polishing stop. A nonvolatile memory element following such a step is shown in FIG. 8(b).

Next, as shown in FIG. 8(c), an insulating film 10 for a groove can be removed by dry etching, for example. This can result in a buried conductive film 13 that extends above a conductive film 14. A buried conductive film 13 may then be processed into a predetermined pattern.

Next, a second conductive film may be deposited over an entire surface. A second conductive film can be a tungsten film having a film thickness on the order of about 150 nm. An etch back of a second conductive film and an etching of conductive film 14 can be conducted. A nonvolatile memory element following such etching is shown in FIG. 9(a). As shown in FIG. 9(a), a first gate electrode end portion 8a and a second gate electrode end portion 8b are formed on side walls of a gate electrode 8'. In addition, patterned polycrystalline silicon layers 14a and 14b can be formed. Such a formation can be essentially simultaneous with first and second gate electrode end portions (8a and 8b). Still further, in such a formation step, third insulating films 6 and 6a can serve as etch stops.

Next, as shown in FIG. 9(b), an ion implantation may be conducted with a gate electrode 8', first gate electrode end portion 8a, and second gate electrode end portion 8b as masks. Such a step may implant ions through first insulating films (4 and 4a), second insulating films (5 and 5a), and third insulating films (6 and 6a), to thereby form a first diffusion layer 2 and a second diffusion layer 3 in a surface of silicon substrate 1. An implanted ion may be arsenic.

Next, a heat treatment can be conducted for impurity diffusion of implanted ions of the above-mentioned first and second diffusion layers (2 and 3). Such a diffusion can result in a first gate electrode end portion 8a and a patterned polycrystalline silicon layers 14a that overlap a first diffusion layer 2 by way of a laminate film that includes first insulating film 4a, second insulating film 5a, and third insulating film 6a. In addition, a second gate electrode end portion 8b and a patterned polycrystalline silicon layers 14b can overlap a second diffusion layer 2 by way of a laminate film that includes a first insulating film 4, second insulating film 5, and third insulating film 6. After such a treatment, a nonvolatile memory element having a structure according to another embodiment can be completed.

In the above-described embodiments of nonvolatile memory elements, end portions of a gate electrode can overlap first or second diffusion regions (e.g., 2 and 3). However, in some cases it may be desirable to minimize or essentially eliminate such an overlap. One such approach is shown in FIG. 10.

Figure 10:
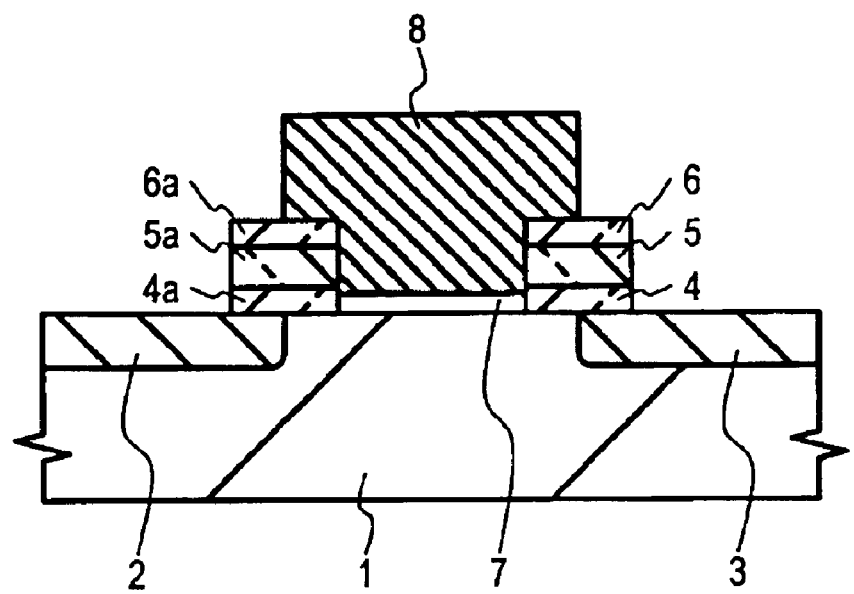
FIG. 10 is a sectional view of a nonvolatile memory element according to another embodiment of the present invention.

FIG. 10 is a sectional view of a nonvolatile memory element according to another embodiment. In FIG. 10, a nonvolatile memory element may include a first diffusion layer 2 and a second diffusion layer 3 formed in a main surface of a substrate 1. A laminate film, which can be an ONO type film, may be included. Such a laminate film is shown by first insulating films 4a and 4, second insulating films 5a and 5, and third insulating films 6a and 6 being formed near first diffusion layer 2 and second diffusion layer 3, respectively. A gate insulating film 7, different from the above-mentioned laminate film(s), can be formed over a major region of a channel area.

Referring still to FIG. 10, a gate electrode 8 can be formed to cover the above-mentioned gate insulating film 7 and portions of the above-described laminate films. However, in the case of FIG. 10, a gate electrode 8 does not overlap a first diffusion layer 2 or second diffusion layer 3.

Figure 11:
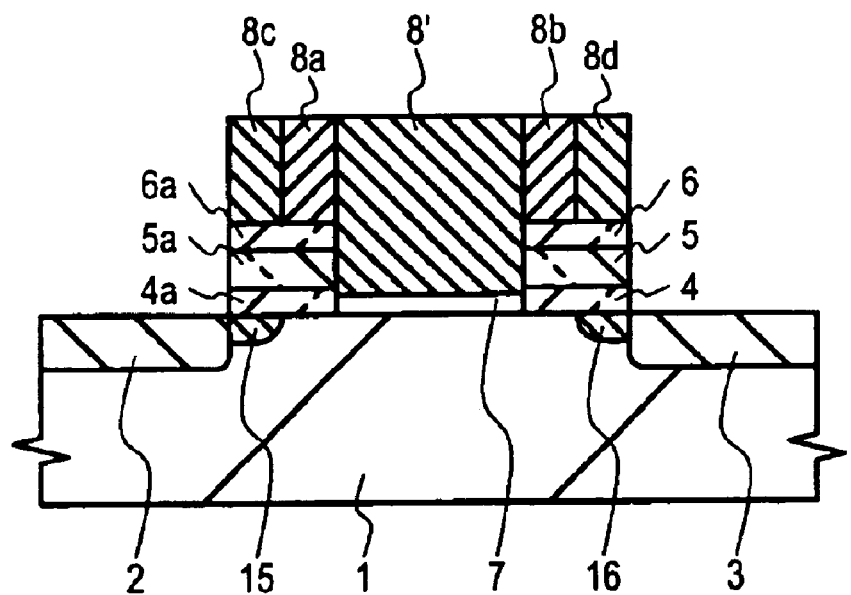
FIG. 11 is a sectional view of a nonvolatile memory element according to another embodiment of the present invention.
Figure 12:
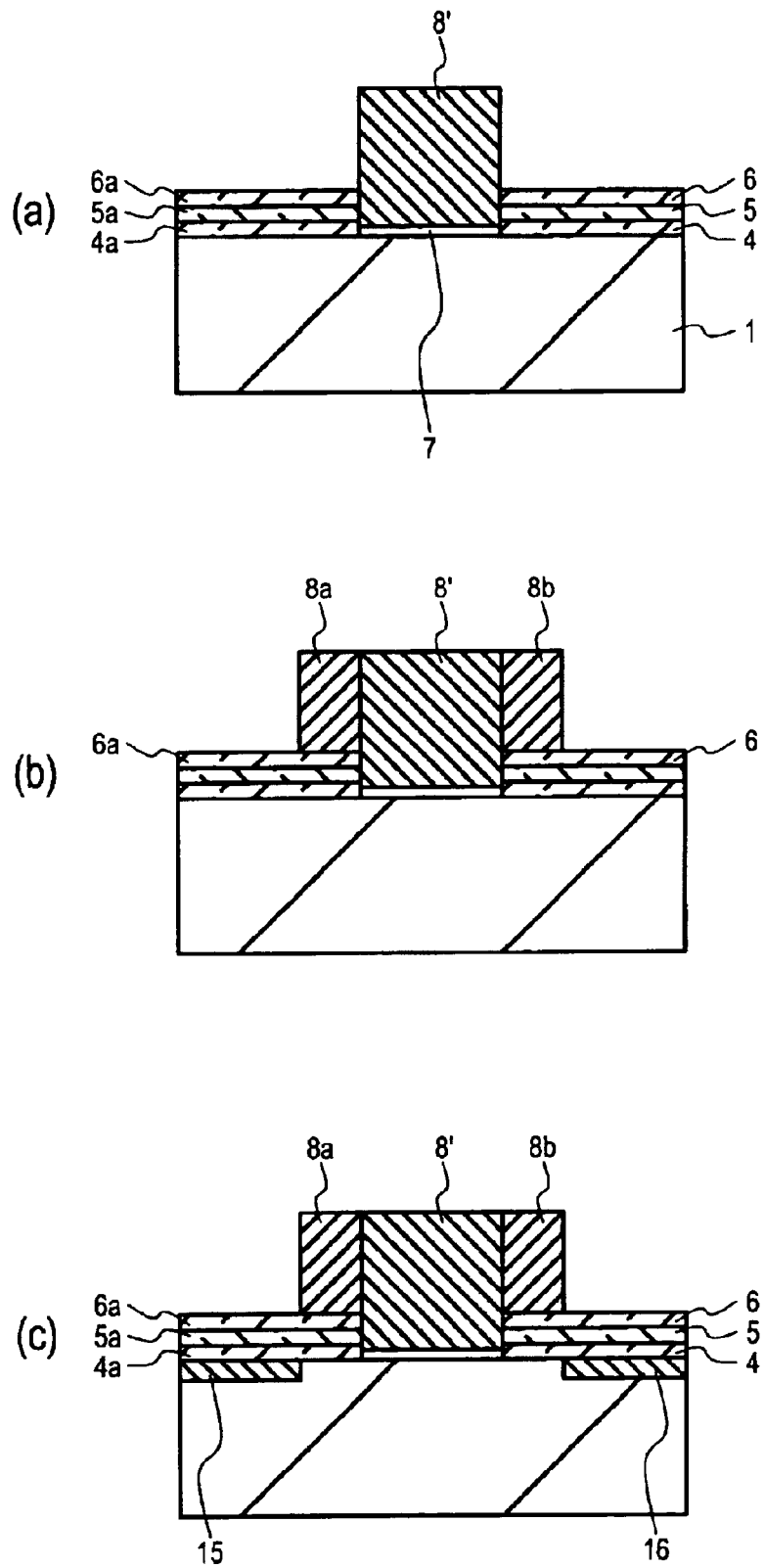
FIGS. 12(a) to 12(c) are sectional views showing selected steps for a method of manufacturing an embodiment like that of FIG. 11.
Figure 13:
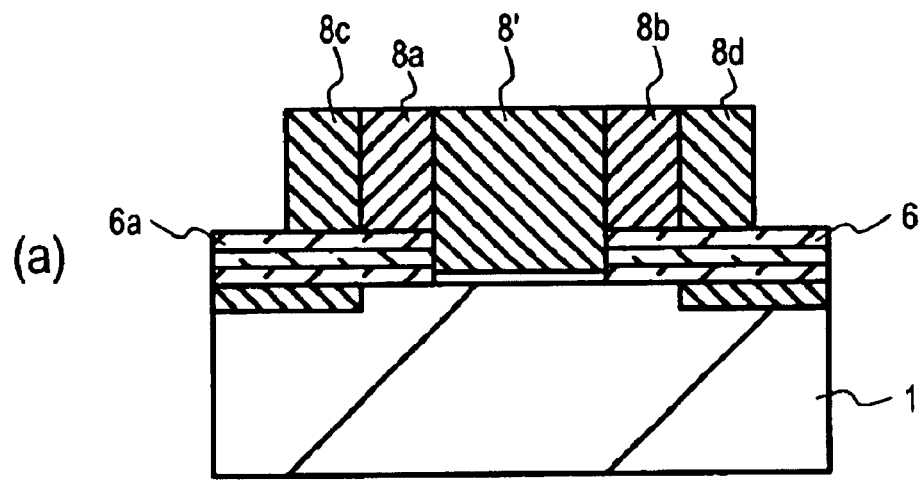
FIGS. 13(a) and 13(b) are sectional views showing further selected steps of the method shown in FIGS. 12(a) to 12(c).
Figure 13:
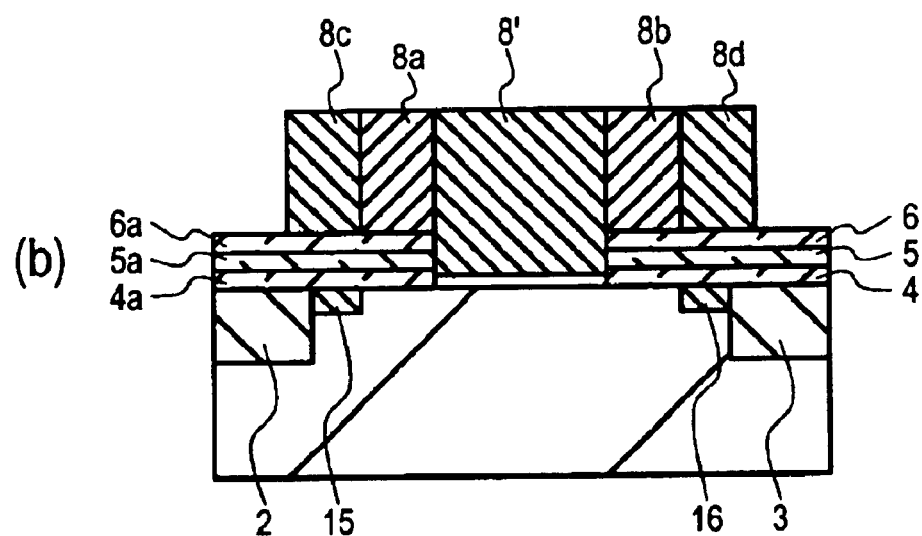

Next, another embodiment of the present invention will be described with reference to FIGS. 11 to 13(b). FIG. 11 is a sectional view showing the basic structure of a nonvolatile memory element according to one embodiment that may be used in a flash memory. In addition, FIGS. 12(a) to 13(b) are sectional views showing various manufacturing steps for a nonvolatile memory element like that of FIG. 11.

A nonvolatile memory element according to an embodiment like that of FIG. 11 can be characterized by having double end portions formed from one or more conductive materials formed in side walls of a gate electrode 8'. In addition, diffusion layers can include extension regions.

As shown in FIG. 11, a nonvolatile memory element may include a first diffusion layer 2 and a second diffusion layer 3 formed in a main surface of a substrate 1. A first extension region 15 can extend from a first diffusion layer 2, and a second extension region 16 can extend from a second diffusion layer 3.

A laminate film, which can be an ONO type film, can be formed on a surface of a substrate 1 near a first extension region 15 and a second extension region 16. Such a laminate film is shown by first insulating films 4a and 4, second insulating films 5a and 5, and third insulating films 6a and 6 being formed near first diffusion layer 2 and second diffusion layer 3, respectively. A gate insulating film 7, different from the above-mentioned laminate film(s), can be formed over a major region of a channel area.

Referring still to FIG. 11, a gate electrode 8' can be formed to cover the above-mentioned gate insulating film 7. Further, a first gate electrode end portion 8a, a second gate electrode end portion 8b, a third gate electrode end portion 8c, and a fourth gate electrode end portion 8d can be formed over the above-described laminate film. In the particular example of FIG. 11, a first insulating film 4a, second insulating film 5a, and third insulating film 6a can be sandwiched between a first extension region 15 and a third gate electrode end portion 8c. Similarly, a first insulating film 4, second insulating film 5, and third insulating film 6 can be sandwiched between a second extension region 16 and a fourth gate electrode end portion 8d.

A gate electrode 8' may be formed from polycide, polymetal, or the like. A first gate electrode end portion 8a, second gate electrode end portion 8b, third gate electrode end portion 8c, and a fourth gate electrode end portion 8d can be made from polycrystalline Si containing an N-type impurity, polycrystalline SiGe, or the like.

The inclusion of extension regions (e.g., 15 and 16) can result in an improved punch through withstand voltage. In addition, such an arrangement may make it easier to generate holes for interband tunneling from a substrate to a laminate film. This can increase the speed at which an erase (or write) operation can occur.

A method of manufacturing a nonvolatile memory element, like that of FIG. 11, will now be described. Such a method can include the same essential steps as shown in FIGS. 4(a) to 5(c). Such steps can result in an arrangement like that shown in FIG. 12(a): first insulating films (4 and 4a), second insulating films (5 and 5a), and third insulating films (6 and 6a) can be formed on substrate 1, and gate electrode 8 can be formed on gate insulating film 7.

Next, a film, preferably a polycrystalline silicon film, having a film thickness on the order of 200 nm can be formed over an entire surface. Then, such a film can be etched back to form a first gate electrode end portion 8a and second gate electrode end portion 8b on side walls of gate electrode 8', as shown in FIG. 12(b). In such a step, third insulating films 6 and 6a can serve as etch stoppers.

Next, as shown in FIG. 12(c), an ion implantation may be conducted with a gate electrode 8', a first gate electrode end portion 8a, and a second gate electrode end portion 8b as masks. Such a step may implant ions through first insulating films (4 and 4a), second insulating films (5 and 5a), and third insulating films (6 and 6a), to thereby form a first extension region 15 and a second extension region 16 in a substrate 1.

Next, a film, preferably a polycrystalline silicon film, having a film thickness on the order of 200 nm can be formed over an entire surface. Then, such a film can be etched back to form a third gate electrode end portion 8c on a side wall of a first gate electrode end portion 8a, and to form a fourth gate electrode end portion 8d on a side wall of a second gate electrode end portion 8b. Such an arrangement is shown in FIG. 13(a). It is noted that a gate electrode 8', a first gate electrode end portion 8a, a second gate electrode end portion 8b, a third gate electrode end portion 8c, and a fourth gate electrode end portion 8d can all be electrically connected.

Next, as shown in FIG. 13(b), an ion implantation may be conducted with a gate electrode 8', a first gate electrode end portion 8a, a second gate electrode end portion 8b, a third gate electrode end portion 8c, and a fourth gate electrode end portion 8d used as masks. Such a step may implant ions through first insulating films (4 and 4a), second insulating films (5 and 5a), and third insulating films (6 and 6a), to thereby form a first diffusion layer 2 and a second diffusion layer 3 in a substrate 1. In such an arrangement, a first diffusion layer 2 may be electrically connected with a first extension region 15, and a second diffusion layer 3 may be electrically connected with a second extension region 16.

In this way, a nonvolatile memory element like that shown in FIG. 11 can be manufactured.

Figure 14:
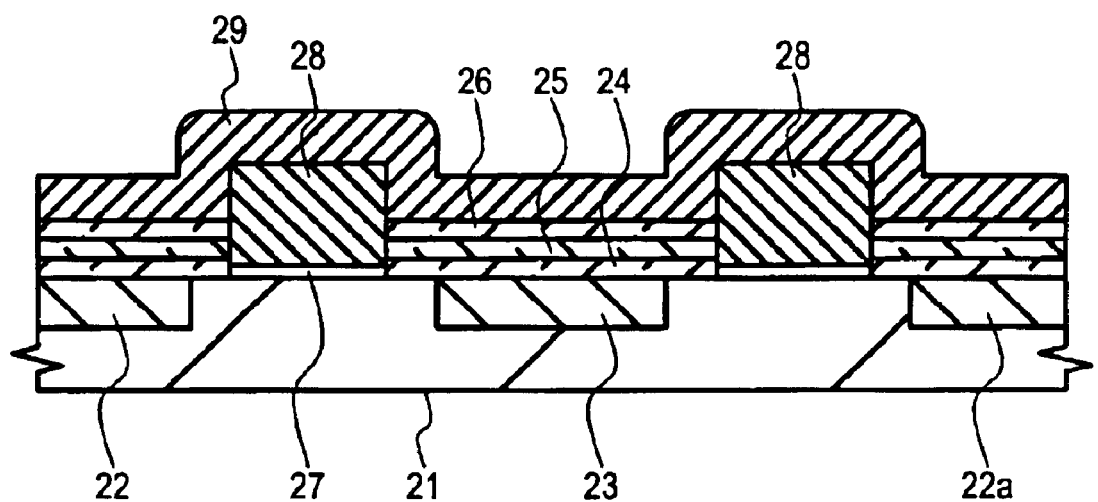
FIG. 14 is a sectional view of a nonvolatile memory element according to another embodiment of the present invention.
Figure 15:
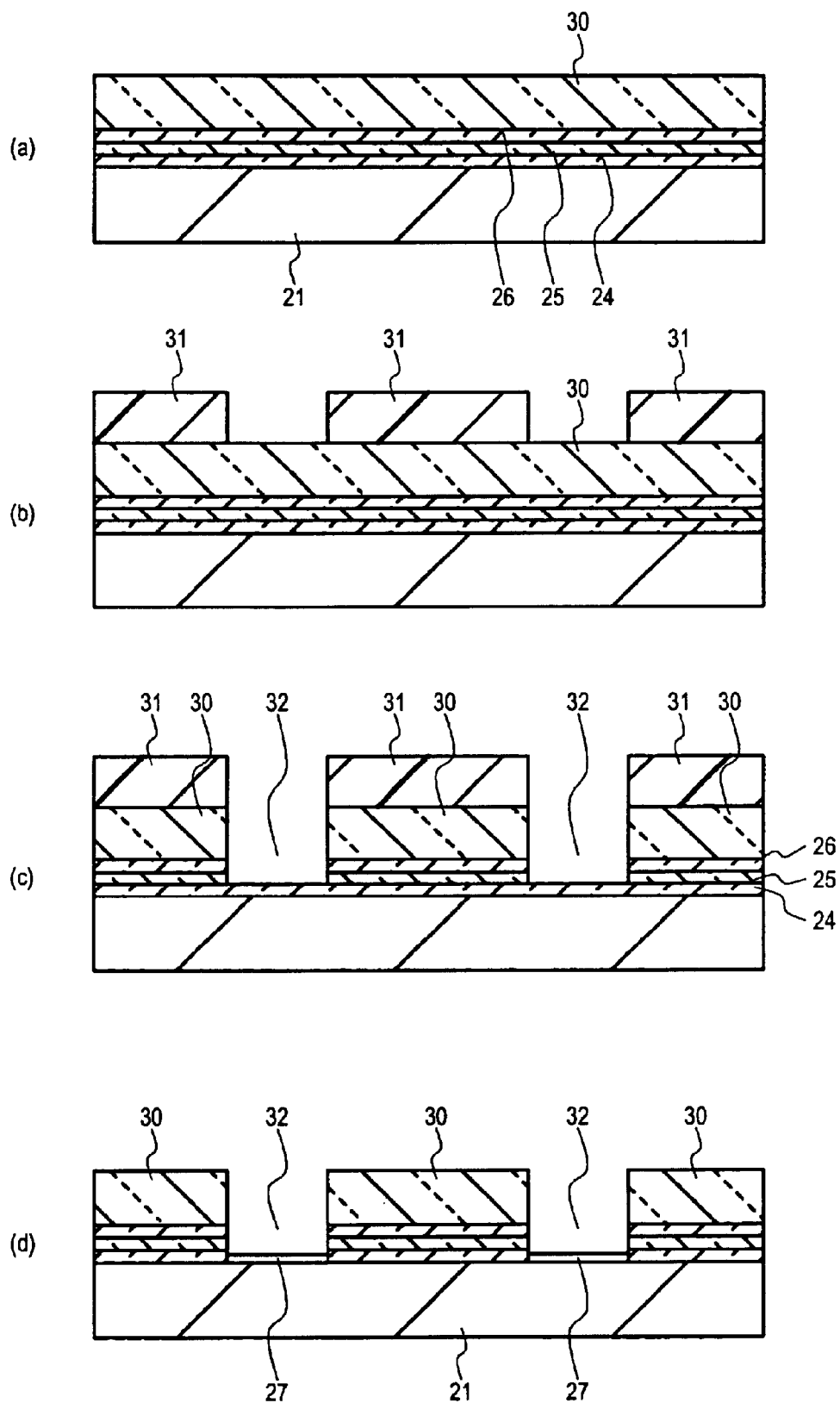
FIGS. 15(a) to 15(d) are sectional views showing selected steps for a method of manufacturing an embodiment like that of FIG. 14.
Figure 16:
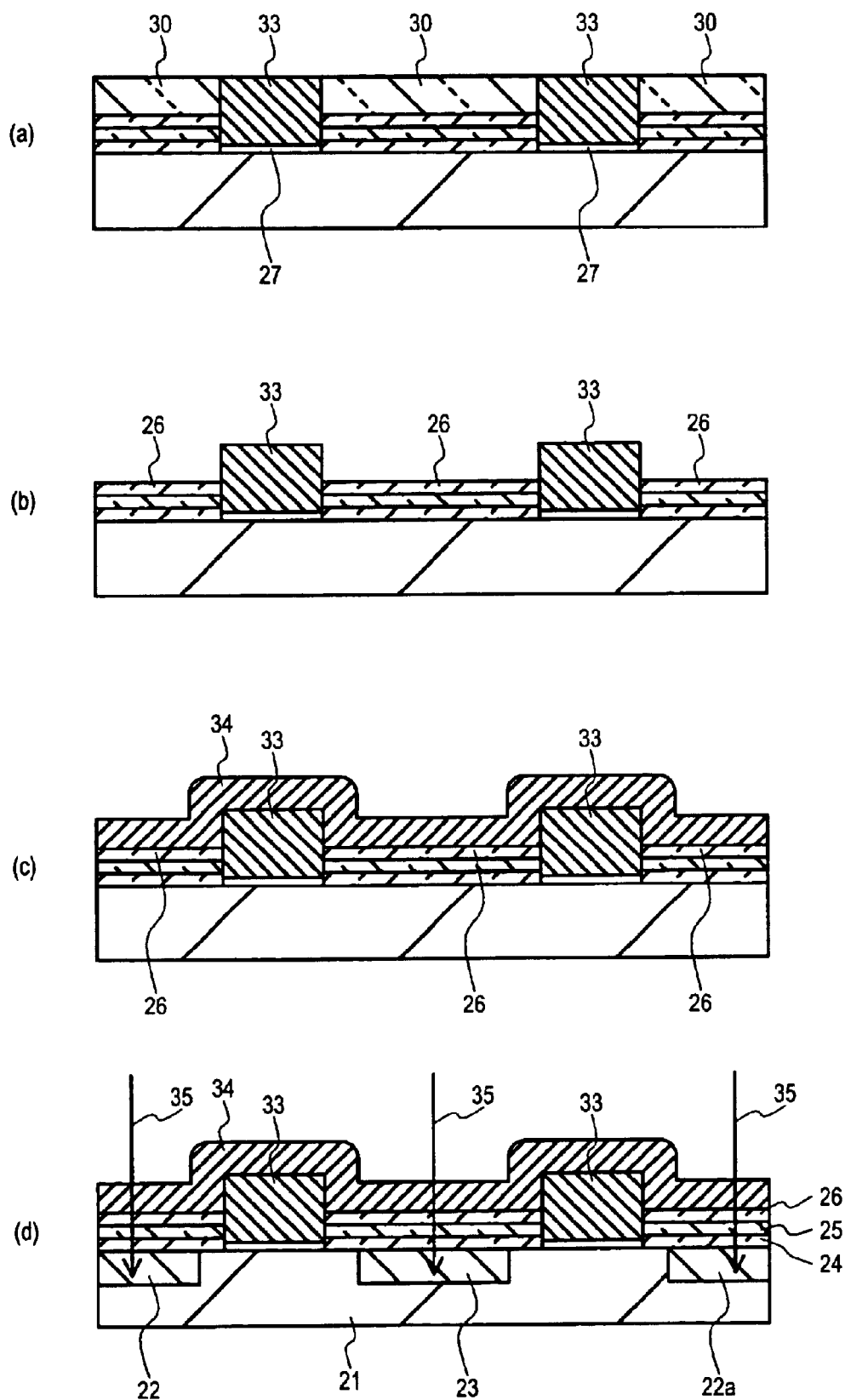
FIGS. 16(a) to 16(d) are sectional views showing further selected steps of the method shown in FIGS. 15(a) to 15(d).
Figure 17:
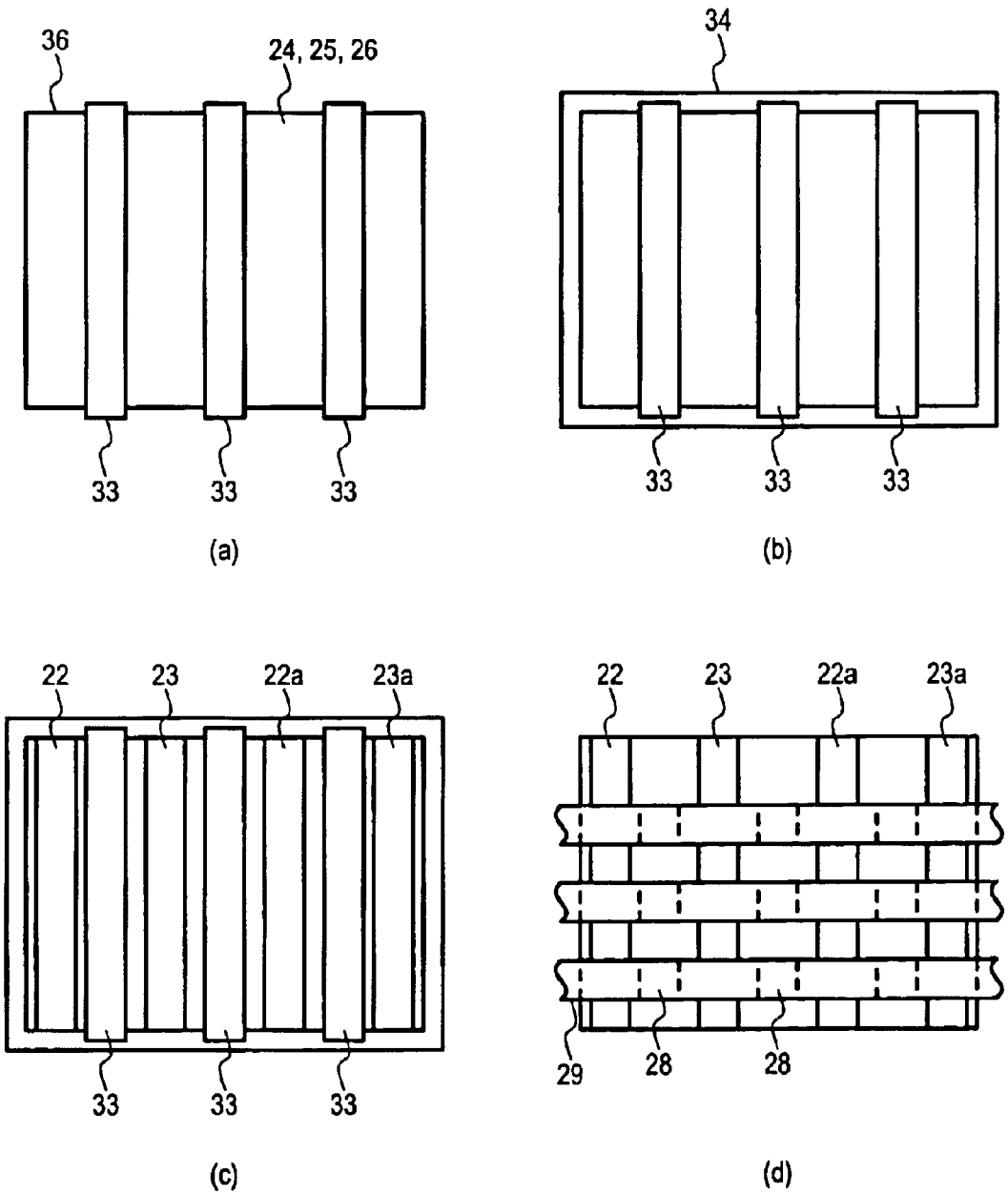
FIGS. 17(a) to 17(d) are plan views showing selected steps for a method of manufacturing an embodiment like that of FIG. 14.

Another embodiment will now be described with reference to FIGS. 14 to 17(d). FIG. 14 is a sectional view of a nonvolatile memory element according to an embodiment that can be used as a flash memory cell. In addition, FIGS. 15(a) to 16(d) are sectional views showing a method for manufacturing a nonvolatile memory element like that of FIG. 14. FIGS. 17(a) to 17(d) are plan views showing a method that applies a nonvolatile memory element like that of FIG. 14 as a flash memory cell.

Referring now to FIG. 14, a sectional view includes two memory cells. Such an arrangement can include first diffusion layers 22 and 22a and second diffusion layer 23 formed in a substrate 21. A substrate 21 can be a P-conductivity type silicon substrate, and first and second diffusion layers (22, 22a and 23) can be N+ diffusion layers. First and/or second diffusion layers (22, 22a and 23) can be bit lines of memory cells. On a main surface of a substrate 21, a laminate film can be formed that is in a region adjacent to a source/drain transistor, but is not formed over an entire channel region. A laminate film may have an ONO type structure. In FIG. 14, such a laminate film can include a first insulating film 24, a second insulating film 25, and a third insulating film 26 formed near first diffusion layers (22 and 22a) and/or second diffusion layer 23. Also shown is a gate insulating film 27 that can be different than the above-mentioned laminate film. A gate insulating film 27 can be formed over a major region of a channel, and may preferably be formed of silicon oxide.

Referring still to FIG. 14, gate electrodes 28 can be formed to cover the above-mentioned gate insulating film 27. Gate electrodes 28 can be formed from polycrystalline silicon containing an N-type impurity. A word line 29 may be electrically connected to gate electrodes 28, and can be disposed orthogonal to diffusion layers composing the above mentioned word lines. A word line 29 can cover the above-mentioned laminate film, and be arranged so that such a laminate film is sandwiched by a word line 29 and diffusion layers (22 or 22a or 23). A word line 29 may preferably be formed from a high melting point metallic film, a polycide film, or the like.

Still further, in an arrangement like that of FIG. 14, a silicon oxide film, or the like, may be formed between a gate electrode 28 and a second insulating film 25. Such a second insulating film 25 can be formed from silicon nitride.

Next, a method of manufacturing a nonvolatile memory element applied as a memory cell, like that of FIG. 14, will now be described. Such a method can be similar to that described with reference to FIGS. 4(a) to 5(c).

As shown in FIG. 15(a), a silicon oxide film may be formed by thermal oxidation to form a first insulating film 24. A silicon nitride film may then be formed, by a chemical vapor deposition (CVD) method for example, to form a second insulating film 25. A second insulating film 25 may be subject to a thermal oxidation that can include an oxygen radical, to form a third insulating film 26. After such a treatment, an alumina film or silicon nitride film having a film thickness of about 50 nm may be formed on a third insulating film 26 to form an insulating film 30 for a groove.

Next, as shown in FIG. 15(b), a resist mask 31 can be formed over an insulating film 30 that includes a groove pattern using a known lithography technique.

Then, as shown by FIG. 15(c), an insulating film 30 for a groove, a third insulating film 26, and second insulating film 25 can be etched with resist mask 31 as an etch mask to form grooves 32. Thereafter, a first insulating film 24 at the bottom of grooves 32 may be removed, by wet etching, for example.

Next, a thermal oxidation treatment can be conducted using insulating film 30 as a mask. This may form gate insulating films 27 on a surface of a substrate 21 in a groove portion 32, as shown in FIG. 15(d). A gate insulating film 27 can be formed to have an effective film thickness that is thinner than an effective film thickness of a laminate film formed form first insulating film 24, a second insulating film 25, and a third insulating film 26.

Like the embodiment of FIGS. 4(a) to 5(c), an above oxidation treatment can be conducted in an oxygen radical atmosphere. In such a case, side walls of a second insulating film 25, which can be silicon nitride, can be easily oxidized to thereby form a silicon oxide on those exposed regions.

Next, a first conductive film can be formed that covers gate insulating films 27 and fills grooves 32. A first conductive film may be a polycrystalline silicon film that contains an N-type impurity, for example. Portions of such a first conductive film can be removed, by a CMP method for example that uses an insulating film 30 as a polishing stop. Such a step can form buried conductive films 33, as shown in FIG. 16(a).

Next, as shown in FIG. 16(b), an insulating film 30 for a groove can be removed by wet etching, for example. This can result in buried conductive films 33 that extend above third insulating film 26.

Next, as shown in FIG. 16(c), a conductive film 34 can be formed as a second conductive film over an entire surface. Such a conductive film 34 can adhere to buried conductive films 33 and third insulating film 26. A conductive film 34 may preferably be a tungsten film having a thickness on the order of about 200 nm.

Next, as shown in FIG. 16(d), an ion implantation may be conducted with buried conductive films 33 as masks. An implanted ion can be arsenic, for example. In such a step, an implantation energy can be selected to implant ions through a first insulating film 24, second insulating film 25, and third insulating film 26 to thereby form first diffusion layers 22 and 22a and a second diffusion layer 23 in a surface of silicon substrate 21. In such an ion implantation step, implanted ions may be essentially prevented from being implanted into regions of substrate 21 below buried conductive films 33 and portions of the second conductive film 34 formed on sides of the buried conductive films 33.

Next, the above mentioned second conductive film 34 and buried conductive films 33 can be patterned, by lithography and dry etching techniques for example, to thereby form a word line 29 and gate electrodes 28, as shown in FIG. 14. Such features can be simultaneously formed by a same etching step. In this way, the formation of a nonvolatile memory element like that of FIG. 14 can be completed.

A method of manufacturing nonvolatile memory elements as memory cells will now be described with reference to a number of plan views.

FIG. 17(a) is a plan view that shows a well layer 36, and a region in which a first insulating film 24, second insulating film 25 and third insulating film 26 are formed. Buried conductive films 33 are also shown. Such an arrangement can correspond to the sectional view set forth in FIG. 16(b).

Next, as shown in FIG. 17(b), a conductive film 34 can be formed over an entire surface so as to cover buried conductive films 33 and regions having first, second and third insulating films (24, 25 and 26). Such an arrangement can correspond to the sectional view set forth in FIG. 16(c).

Next, as shown in FIG. 17(c), an ion implantation, of arsenic for example, and a heat treatment can be conducted to form first diffusion layers 22 and 22a and second diffusion layers 23 and 23a. Such first and second diffusion layers (22, 22a, 23, and 23a) can be parallel to buried conductive films 33. Such an arrangement can correspond to the sectional view set forth in FIG. 16(d).

Next, as shown in FIG. 17(d), conductive film 34 and buried conductive films 33 can be processed to form word lines 29 and gate electrodes 28 essentially simultaneously. It is noted that in such an arrangement, bit lines, which may be formed by first or second diffusion layers (22, 22a, 23, and 23a), can be essentially orthogonal to word lines 29.

Figure 18:
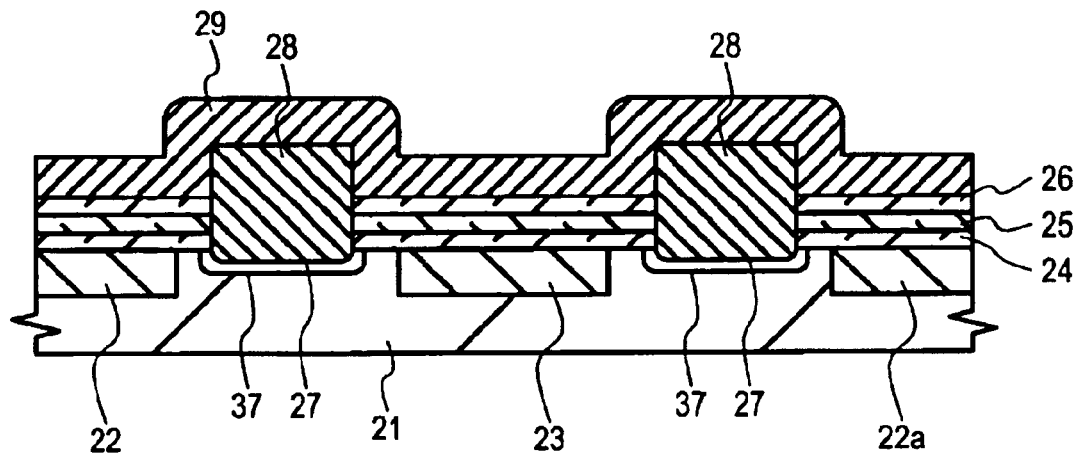
FIG. 18 is a sectional view of a nonvolatile memory element according to another embodiment of the present invention.

Another embodiment will now be described with reference to FIG. 18. FIG. 18 is a sectional view of a nonvolatile memory element that can be used as a flash memory cell. The arrangement of FIG. 18 can differ from that of FIG. 14 in that a channel region of a resulting transistor can be produced in a shallow groove portion.

As shown in FIG. 18, a nonvolatile memory element arrangement can include first diffusion layers 22 and 22a and second diffusion layer 23 formed in a substrate 21. A substrate 21 can be a P-conductivity type silicon substrate, and first and second diffusion layers (22, 22a and 23) can be N+ diffusion layers. First and/or second diffusion layers (22, 22a and 23) can be bit lines of memory cells. On a main surface of a substrate 21, a laminate film can be formed that is in a region adjacent to a source/drain transistor, but is not formed over an entire channel region. A laminate film may have an ONO type structure. In FIG. 18, such a laminate film can include a first insulating film 24, a second insulating film 25, and a third insulating film 26 formed near first diffusion layers (22 and 22a) and/or second diffusion layer 23. Also shown in FIG. 18 is a gate insulating film 27 that can be different than the above-mentioned laminate film, and can be formed over a major region of a channel. Channel grooves 37 can be formed in those regions that become channels. A gate insulating film 27 may preferably be formed of silicon oxide.

Referring still to FIG. 18, gate electrodes 28 can be formed to cover the above-mentioned gate insulating film 27. Gate electrodes 28 can be formed from polycrystalline silicon containing an N-type impurity. A word line 29 may be electrically connected to gate electrodes 28, and can be disposed orthogonal to diffusion layers composing the above mentioned word lines. A word line 29 can cover the above-mentioned laminate film, and be arranged so that such a laminate film is sandwiched by the word line 29 and diffusion layers (22 or 22a or 23).

A nonvolatile memory element like that of FIG. 18 can have the same essential effects as that of shown in FIGS. 1, 2, 4(a)–5(c) and 14–17(d).

It is also noted that, as described above, a conductive film 34 can be dry etched to form word lines 29 and gate electrodes essentially simultaneously (e.g., as described with reference to FIG. 17(d)). Such an etching step may be easier than nonvolatile memory elements that include FG type transistors because such FG arrangements include an ONO type structure between a control gate and a floating gate. Obviously, such an arrangement does not occur in the nonvolatile memory elements according to the present invention described above.

Figure 19:
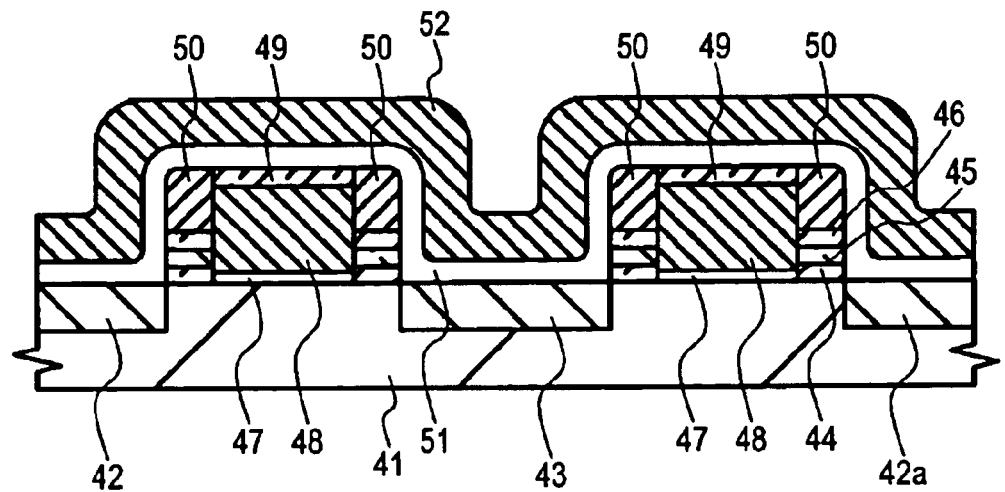
FIG. 19 is a sectional view of a nonvolatile memory element according to another embodiment of the present invention.

Another embodiment will now be described with reference to FIGS. 19 to 21(d). FIG. 19 is a sectional view of a nonvolatile memory element that can be applied to a flash memory. FIGS. 20(a) to 21(d) are sectional views and plan views showing steps of a method for manufacturing a nonvolatile memory element like that of FIG. 19. FIGS. 19 to 21(d) shows an arrangement in which locations for interband tunneling (e.g., hole tunneling) can be separately provided for devices.

FIG. 19, like the arrangement of FIG. 14, shows a sectional view of two memory cells. Such an arrangement can include first diffusion layers 42 and 42a and second diffusion layer 43 formed in a substrate 41. A substrate 41 can be a P-conductivity type silicon substrate, and first and second diffusion layers (42, 42a and 43) can be N+ diffusion layers. First and/or second diffusion layers (42, 42a and 43) can be bit lines of memory cells. On a main surface of a substrate 41, a laminate film can be formed that is in a region adjacent to a source/drain transistor, but is not formed over an entire channel region. A laminate film may have an ONO type structure. In FIG. 19, such a laminate film can include a first insulating film 44, a second insulating film 45, and a third insulating film 46 formed near first diffusion layers (42 and 42a) and/or second diffusion layer 43. Also shown is a gate insulating film 47 that can be different than the above-mentioned laminate film, and be formed over a major region of a channel.

Referring still to FIG. 19, a gate electrode 48 can be formed to cover the above-mentioned gate insulating film 47. Gate electrode 48 can be formed from a polycide film. A cap insulating film 49 can be formed on gate electrode 48 in the same essential pattern. In addition, gate electrode side portions 50 can be electrically connected with the above-mentioned gate electrode 48 and formed on side walls thereof. In the above mentioned arrangement, a silicon oxide film, or the like, may be formed between a gate electrode 48 and a second insulating film 45. Such second insulating film 45 can be formed from silicon nitride.

FIG. 19 also shows a control insulating film 51 that can be formed on an entire surface. A control insulating film 51 can preferably be a film of silicon oxide having a thickness on the order of about 3 nm. A control wiring 52 can be provided to cover a control insulating film 51. In the arrangement of FIG. 19, a control wiring 52 is provided that is substantially orthogonal to diffusion layers (e.g., 42, 42a or 43), which can form bit lines.

The arrangement set forth in FIGS. 19 to 21(d) can facilitate the production of holes for interband tunneling, and thus facilitate the speed of an erase operation or write operation. This will be described below in more detail with reference to FIGS. 22 and 23.

A manufacturing method for producing a nonvolatile memory of FIG. 19 will now be described. Such a manufacturing method can include the same essential steps described in FIGS. 15(a) to 16(b). Thus, the following description will assume that structure like that of FIG. 16(b) has been produced. Thus, gate wirings 48 (like buried conductive films 33 of FIG. 16(b)) can be formed that extend above a third insulating film 46.

Referring now to FIG. 20(a), a cap insulating film 49 can be formed on the above-mentioned gate wirings 48. A cap insulating film 49 may preferably be silicon oxide and gate wirings 48 may be a high melting point metal polycide film.

Next, as shown in FIG. 20(b), a second conductive film can be deposited over an entire surface. An entire surface etch back may then be conducted to form gate electrode side portions 50 on side walls of gate wirings 48. Such a step can produce gate wirings 48 and gate electrode side portions 50 having a strip or slit-shaped pattern. Thus, gate electrode side portions 50 can be conductive sidewalls. Such a second conductive film can be a polycrystalline silicon film containing an N-type impurity.

Next, as shown in FIG. 20(c), an implantation of ions 53 may be conducted with gate wirings 48 and gate electrode side portions 50 as masks. An implanted ion 53 can be arsenic, for example. An implantation energy can be selected to form first diffusion layers 42 and 42a and a second diffusion layer 43 in a surface of substrate 41. In such an ion implantation step, implanted ions may be essentially prevented from being implanted into regions of substrate 41 below gate wirings 48 and gate electrode side portions 50.

Next, a high temperature oxidation (HTO) film can be deposited, by a CVD method for example, on an entire surface. In addition, a heat treatment can be conducted. Consequently, as shown in FIG. 20(d), a control insulating film 51, which can be a third oxide film, can be formed to cover first diffusion layers (42 and 42a), second diffusion layer 43, cap insulating film 49, and gate electrode side portions 50.

Subsequently, a conductive film can be formed and patterned to provide a control wiring 52 as shown in FIG. 19. Such a conductive film may be a tungsten film. Further, in such a patterning step, gate wirings 48 may not be etched.

Figure 20:
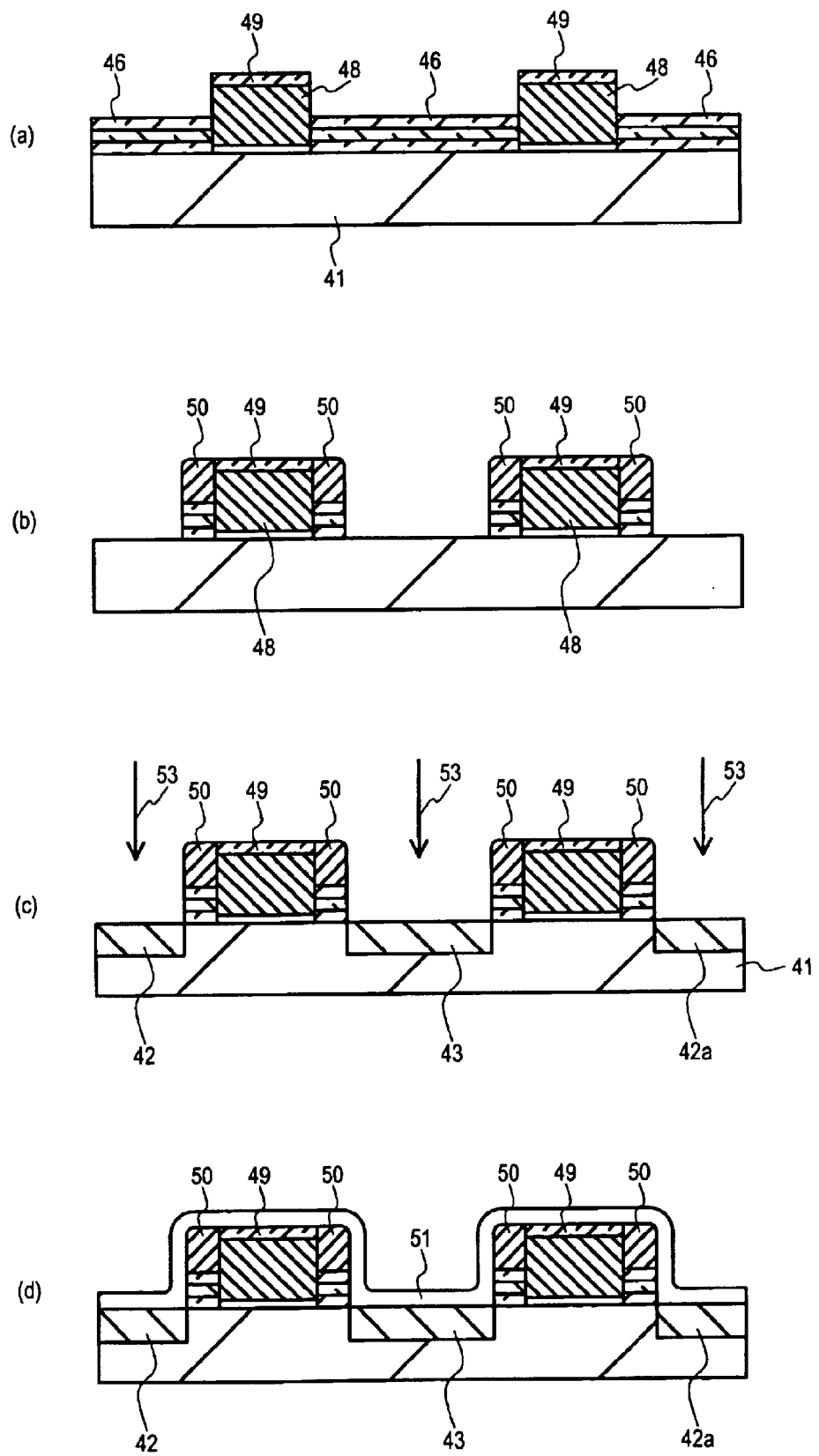
FIGS. 20(a) to 20(d) are sectional views showing selected steps for a method of manufacturing an embodiment like that of FIG. 19.
Figure 21:
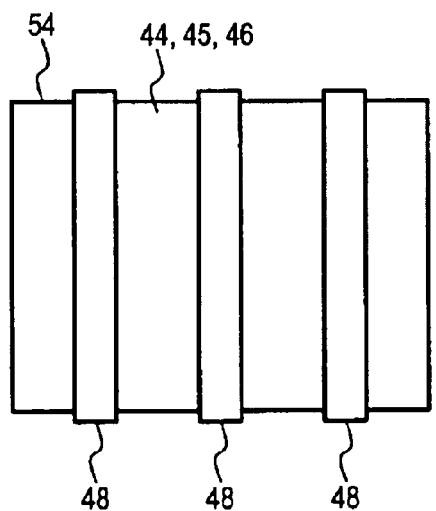
FIGS. 21(a) to 21(d) are plan views showing selected steps for a method of manufacturing an embodiment like that of FIG. 19.
Figure 21:
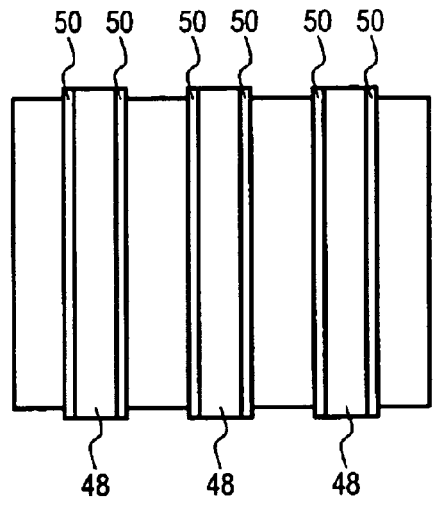
Figure 21:
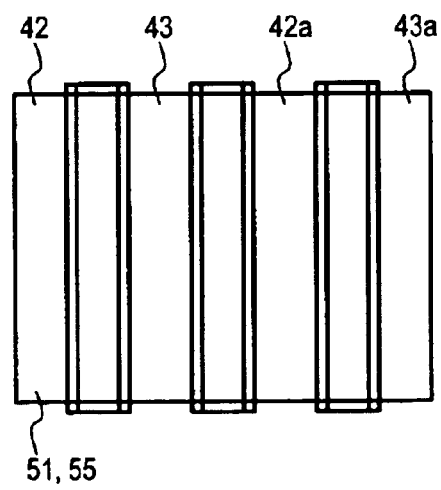
Figure 21:
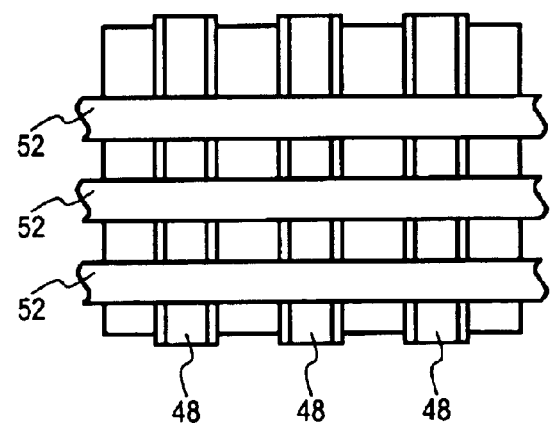

A method of manufacturing nonvolatile memory elements like those of FIGS. 19 to 20(d) will now be described with reference to a number of plan views.

FIG. 21(a) is a plan view that shows a well layer 54, and a region in which a first insulating film 44, second insulating film 45 and third insulating film 46 are formed. Gate wirings 48 are also shown. Such an arrangement can correspond to the sectional view set forth in FIG. 20(a).

Next, as shown in FIG. 21(b), gate electrode side portions 50 can be formed on side walls of gate wirings 48. Such an arrangement can correspond to the sectional view set forth in FIG. 20(b).

Next, as shown in FIG. 21(c), an ion implantation, of arsenic for example, and a heat treatment can be conducted to form first diffusion layers 42 and 42a and second diffusion layers 43 and 43a. Such first and second diffusion layers (42, 42a, 43, and 43a) can be parallel to gate wirings 48. In addition, a control insulating film 51 and conductive film 55 can be formed over an entire surface.

Next, as shown in FIG. 21(d), a conductive film 55 can be processed to form control wirings 52. It is noted that in such an arrangement, gate wirings 48 can be essentially orthogonal to control wirings 52.

Figure 22:
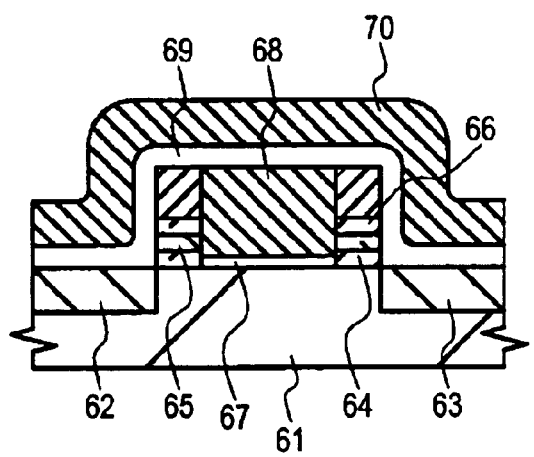
FIG. 22 is a sectional view of a nonvolatile memory element according to another embodiment of the present invention.
Figure 23:
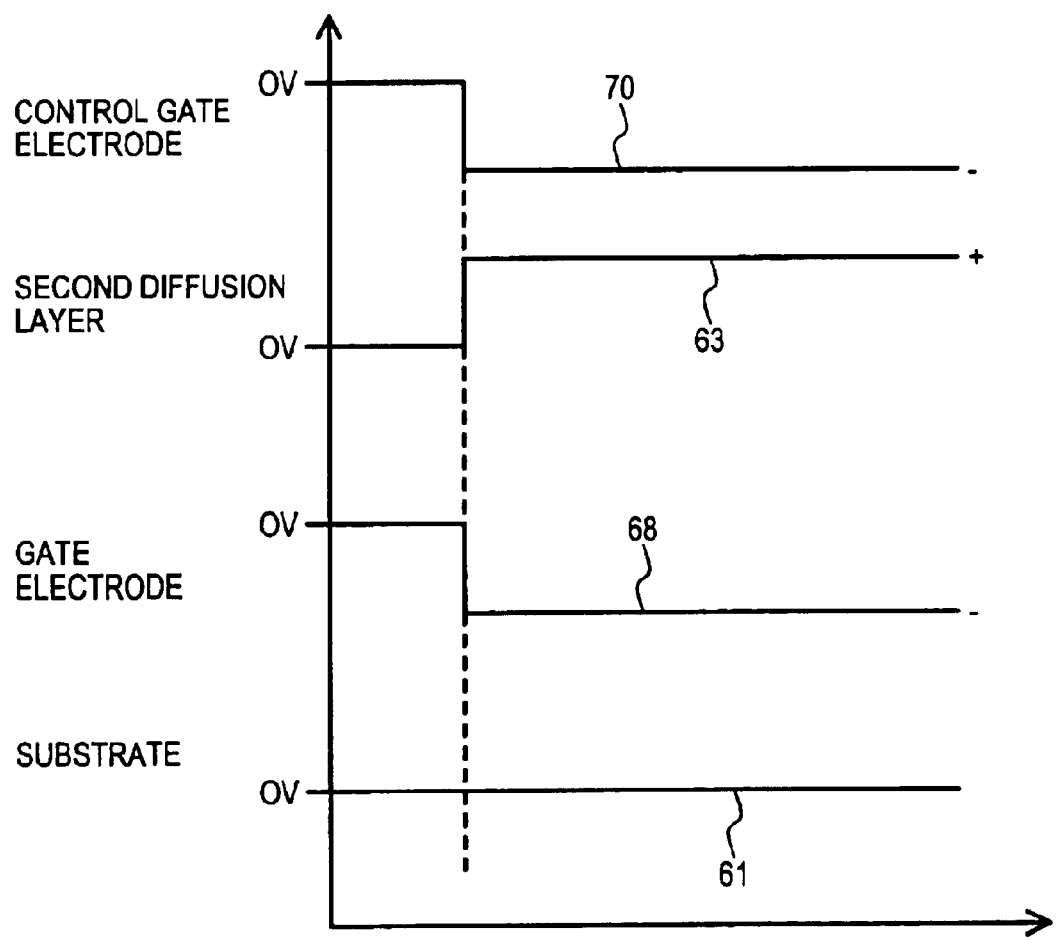
FIG. 23 is a timing diagram showing the operation of a nonvolatile memory element according to an embodiment of the present invention.
Figure 24:
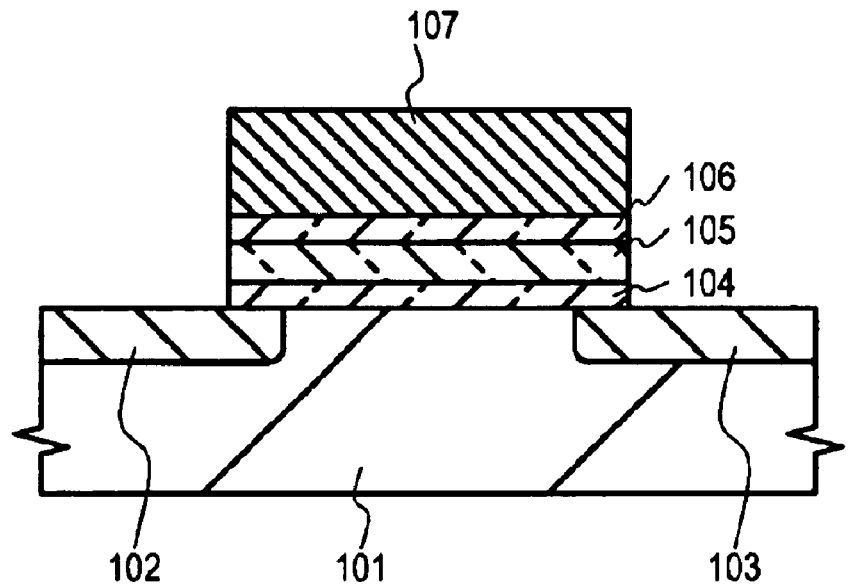
FIG. 24 is a sectional view of a first conventional nonvolatile memory element.
Figure 25:
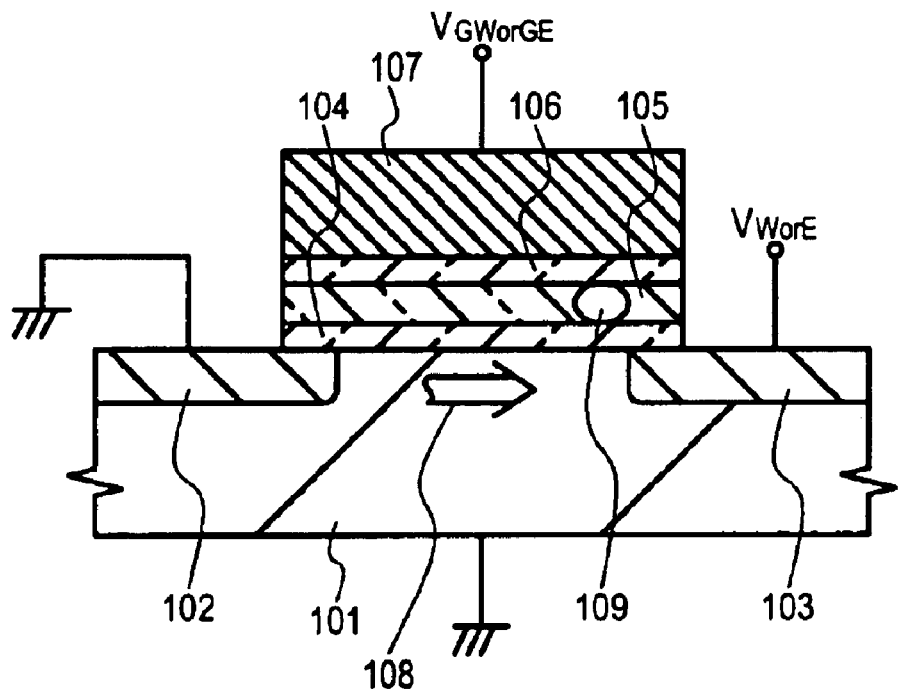
FIG. 25 is a sectional view showing the operation of the first conventional nonvolatile memory element of FIG. 24.
Figure 26:
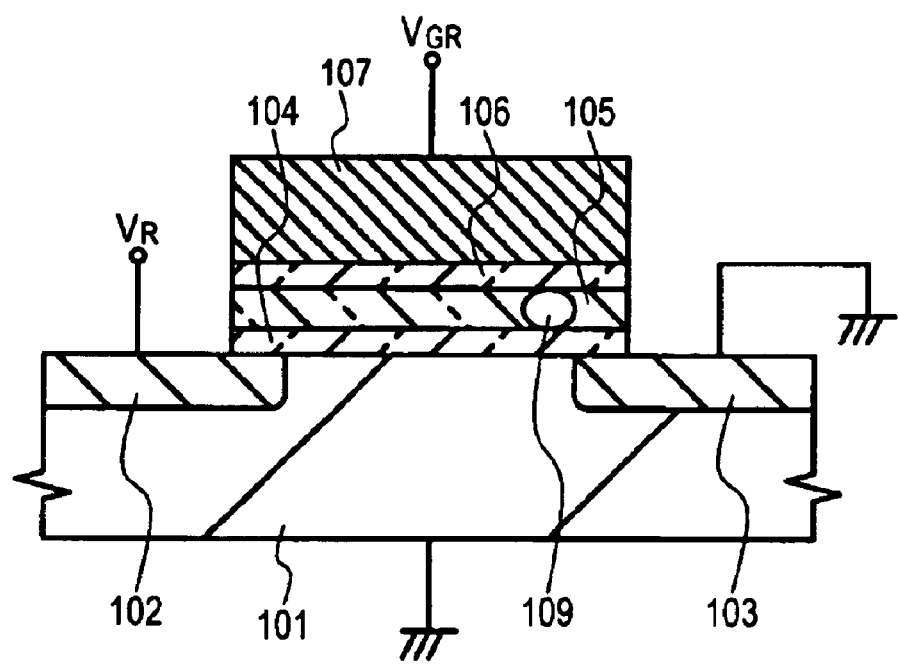
FIG. 26 is a sectional view showing a further operation of the first conventional nonvolatile memory element of FIG. 24.
Figure 27:
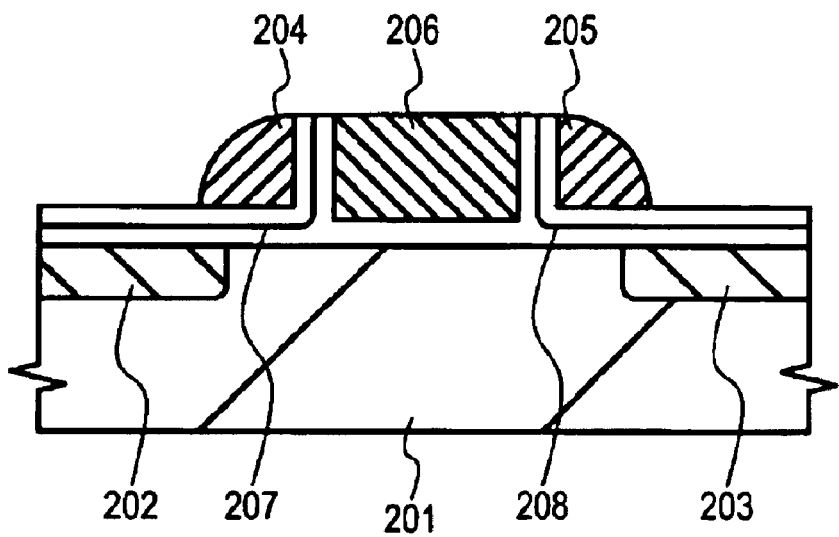
FIG. 27 is a sectional view of a second conventional nonvolatile memory element.

Referring now to FIGS. 22 and 23, another embodiment of the present invention will now be described. FIG. 22 is a sectional view of a nonvolatile memory element according to an embodiment. FIG. 23 is a timing diagram showing the fundamental operation of such an embodiment. In this embodiment, as in the case of FIG. 19, locations for interband tunneling (e.g., hole tunneling) can be separately provided for devices.

FIG. 22, like FIG. 19, shows a first diffusion layer 62 and a second diffusion layer 63 formed in a substrate 61. Further, a laminate film can be formed, not over an entire channel, but on a substrate 61 near first and second diffusion layers (62 and 63). A laminate film can include a first insulating film 64, a second insulating film 65, and a third insulating film 66, which can form an ONO type structure. It is understood that such an arrangement places the first, second and third insulating films (64, 65 and 66) in regions adjacent to the source/drain of a resulting transistor. A gate insulating film 67, that can be different than the above-mentioned laminate film, can be formed over a major region of a transistor channel.

Referring still to FIG. 22, a gate electrode 68 having a T-shaped cross section can also be formed to cover the above-mentioned gate insulating film 67 and laminate film (of first, second and third insulating films (64, 65 and 66)). A gate electrode 68 can be formed from polycide, or the like. A control insulating film 69 can be formed over an entire surface. Such a film may be silicon oxide film having a thickness on the order of about 3 nm. A control electrode 70 can be provided that covers a control insulating film 69. In FIG. 22, a control insulating film 69 can be formed to cover first diffusion layer 62 and second diffusion layer 63. Note that the above-mentioned gate electrode 68 can be formed to overlap a first diffusion layer 62 and second diffusion layer 63, and to sandwich the above mentioned laminate film with respect to a substrate 61.

Next, the operation of a nonvolatile memory element according to such an embodiment will now be described. Such an operation can include producing holes, for an erase operation or for a write operation, by interband tunneling. The operation will now be described with reference to FIGS. 22 and 23.

Referring to FIG. 22, a silicon substrate 61 can be kept at a ground potential. A first diffusion layer 62 can also be kept at a constant potential. In operation, and as shown in FIG. 23, a potential of a control electrode 70 can change from 0V to a negative potential. At essentially the same time, a potential of a second diffusion layer 63 can change from 0V to a positive potential (which can be on the order of about 5V). Such a change in potential can result in very steep band bending at a boundary between a control insulating film 69 and a second diffusion layer 63. As a result, electrons are tunneled from a valence band to a conduction band, thereby generating holes.

Referring still to FIGS. 22 and 23, when a negative potential is provided to a gate electrode 68 during the above conditions, the above-mentioned holes can be attracted toward a second insulating film and trapped in such a region. In the event data has been written by injection of electrons into such a region, as described in the above embodiments, the above mentioned holes are attracted to such "written" electrons by the Coulomb force. The holes and electrodes combine with each other—thereby annihilating one another. In such a case, any threshold shifting introduced by electrons can be essentially eliminated.

It is understood that the above mechanism is also applicable to the embodiment of FIG. 19. Accordingly, FIGS. 22 and 19 show an arrangement in which band bending can be conducted through a control insulating film having a relatively small thickness. A resulting band bending can be steeper than the embodiments of FIGS. 1 and 3. This can lead to greater hole production efficiency.

The arrangement of FIGS. 19 and/or 22 can lead to faster operating speeds. In particular, if it assumed that a write operation results in electrons being injected into a second insulating layer of an ONO type structure, more efficient generation of holes can ensure that the charge presented by such write electrons is cancelled faster than conventional approaches. Hence, faster erase speeds can be achieved. Conversely, if it assumed that a write operation results in holes being injected into a second insulating layer of an ONO type structure, more efficient generation of holes can ensure that such write holes are injected faster than conventional approaches. Hence, faster write speeds can be achieved.

The above embodiments have described MONOS type transistor structures in which a first and third insulating layer are made from a silicon oxide film and a second insulating layer is made from a silicon nitride film. However, such disclosures should not be construed as limiting the invention thereto. For example, a second insulating layer can include a metallic oxide film such as tantalum oxide or hafnium oxide, as but two examples. Further, second insulating layer can be formed by thermally nitriding a surface of a silicon oxide film.

Thus, the present invention should not limited to the particular embodiments disclosed, and can be modified as appropriate by one skilled in the art.

When the various above nonvolatile memory element embodiments are included in a flash memory, a resulting device may have an improved operating speed. More particularly, read speeds can be improved. Further, according the embodiments, a reduction in word line and/or bit line size of memory cell may be achieved, thereby reducing transmission delays.

In addition or alternatively, the embodiments have described arrangements in which a steep band bending can be achieved to enable more efficient hole generation, and hence more efficient interband tunneling of holes. As a result, a write/erase operations of charge into/from a flash memory can occur at higher speeds.

Still further, when the embodiments of the present invention are incorporated into a flash memory, manufacturing may become simplified over conventional approaches, and manufacturing costs may be reduced.

Furthermore, due to improvements that may be achieved according to the various embodiments, it is believed that the application of flash memories can be expanded and/or new application areas can be developed.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A nonvolatile memory device, comprising:
   a first diffusion layer and second diffusion layer separated by a channel region;
   a first insulating layer for trapping a charge formed on a first portion of the channel region adjacent to the first diffusion layer;
   a second insulating layer, different than the first insulating layer, formed on a second portion of the channel region different from the first portion of the channel region; and
   an integrated gate electrode that covers the first insulating layer and second insulating layer.

2. The nonvolatile memory device of claim 1, wherein:
   a capacitance per unit area of the second insulating layer is larger than that of the first insulating layer.

3. The nonvolatile memory device of claim 1, wherein:
   the first insulating layer is a laminate structure comprising a first silicon oxide film, a different film, and a second silicon oxide film, the different film being selected from the group of a silicon nitride film and a metal oxide film.

4. The nonvolatile memory device of claim 1, wherein:
   the integrated gate electrode has a "T" shape in cross section taken along a channel length direction.

5. The nonvolatile memory device of claim 1, wherein:
   the integrated gate electrode includes end portions, and the first insulating layer is sandwiched between at least one end portion and the first diffusion layer.

6. The nonvolatile memory device of claim 1, wherein:
   the integrated gate electrode includes a central portion formed over the second insulating layer and at least one end portion formed over the first insulating layer, the at least one end portion being formed from a different material than the central portion.

7. The nonvolatile memory device of claim 1, further including:
   a word line of a memory cell array coupled to the gate electrode; and
   a bit line of a memory cell array formed from at least one of the diffusion layers.

8. The nonvolatile memory device of claim 7, wherein:
   the word line is essentially orthogonal to the bit line.

9. The nonvolatile memory device of claim 1, further including:
   a third insulating layer that covers the first diffusion layer having a larger capacitance per unit area than the first insulating layer; and
   a conductive layer formed on the third insulating layer.

* * * * *